(12) United States Patent
Imanishi et al.

(10) Patent No.: US 8,426,892 B2
(45) Date of Patent: Apr. 23, 2013

(54) COMPOUND SEMICONDUCTOR DEVICE AND METHOD OF MANUFACTURING THE SAME

(75) Inventors: Kenji Imanishi, Kawasaki (JP); Toshihide Kikkawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 480 days.

(21) Appl. No.: 12/034,273

(22) Filed: Feb. 20, 2008

(65) Prior Publication Data
US 2008/0197359 A1   Aug. 21, 2008

(30) Foreign Application Priority Data
Feb. 20, 2007   (JP) .................................. 2007-038905

(51) Int. Cl.
*H01L 29/267* (2006.01)
*H01L 21/338* (2006.01)

(52) U.S. Cl.
USPC ....... 257/194; 257/76; 257/192; 257/E29.081

(58) Field of Classification Search .................. 257/192, 257/194, E21.403, E29.081, E29.246–E29.253, 257/94, 190, 191
See application file for complete search history.

(56) References Cited

U.S. PATENT DOCUMENTS

| | | | |
|---|---|---|---|
| 6,091,083 A * | 7/2000 | Hata et al. ........................ | 257/79 |
| 6,177,685 B1 | 1/2001 | Teraguchi et al. | |
| 6,441,391 B1 * | 8/2002 | Ohno et al. ...................... | 257/11 |
| 6,534,801 B2 * | 3/2003 | Yoshida .......................... | 257/192 |
| 6,576,054 B1 | 6/2003 | Melnik et al. | |
| 6,579,359 B1 * | 6/2003 | Mynbaeva et al. .............. | 117/94 |
| 6,613,143 B1 | 9/2003 | Melnik et al. | |
| 6,616,757 B1 | 9/2003 | Melnik et al. | |
| 6,656,285 B1 | 12/2003 | Melnik et al. | |
| 6,765,241 B2 * | 7/2004 | Ohno et al. ..................... | 257/192 |
| 6,936,357 B2 * | 8/2005 | Melnik et al. .................. | 428/698 |
| 7,002,189 B2 * | 2/2006 | Kikkawa ....................... | 257/192 |

(Continued)

FOREIGN PATENT DOCUMENTS

| | | |
|---|---|---|
| JP | 11-204778 A | 7/1999 |
| JP | 2000-68498 A | 3/2000 |

(Continued)

OTHER PUBLICATIONS

A. F. Brana et al; "Improved AlGaN/GaN HEMTs using Fe doping"; Electron Devices, 2005 Spanish Conference on pp. 119-121 (2005).

(Continued)

*Primary Examiner* — Long Tran
*Assistant Examiner* — Jordan Klein
(74) *Attorney, Agent, or Firm* — Westerman, Hattori, Daniels & Adrian, LLP

(57) ABSTRACT

A compound semiconductor device has a buffer layer formed on a conductive SiC substrate, an AlxGa1-xN layer formed on the buffer layer in which an impurity for reducing carrier concentration from an unintentionally doped donor impurity is added and in which the Al composition x is 0<x<1, a GaN-based carrier transit layer formed on the AlxGa1-xN layer, a carrier supply layer formed on the carrier transit layer, a source electrode and a drain electrode formed on the carrier supply layer, and a gate electrode formed on the carrier supply layer between the source electrode and the drain electrode. Therefore, a GaN-HEMT that is superior in device characteristics can be realized in the case of using a relatively less expensive conductive SiC substrate compared with a semi-insulating SiC substrate.

11 Claims, 26 Drawing Sheets

U.S. PATENT DOCUMENTS

| | | | |
|---|---|---|---|
| 7,135,715 B2* | 11/2006 | Saxler | 257/103 |
| 7,176,479 B2* | 2/2007 | Ohba | 257/12 |
| 7,208,393 B2* | 4/2007 | Haskell et al. | 438/481 |
| 7,569,870 B2 | 8/2009 | Yanagihara et al. | |
| 7,638,819 B2* | 12/2009 | Kikkawa et al. | 257/194 |
| 2002/0179932 A1 | 12/2002 | Shibata et al. | |
| 2004/0144991 A1* | 7/2004 | Kikkawa | 257/103 |
| 2004/0155260 A1* | 8/2004 | Kuzmik | 257/192 |
| 2005/0263791 A1* | 12/2005 | Yanagihara et al. | 257/194 |
| 2006/0102926 A1* | 5/2006 | Kikkawa et al. | 257/103 |
| 2006/0214187 A1* | 9/2006 | Mita et al. | 257/194 |
| 2006/0226412 A1* | 10/2006 | Saxler et al. | 257/11 |
| 2006/0261370 A1* | 11/2006 | Hoke et al. | 257/194 |
| 2007/0004184 A1* | 1/2007 | Saxler | 438/479 |
| 2007/0120141 A1* | 5/2007 | Moustakas et al. | 257/103 |
| 2008/0054248 A1* | 3/2008 | Chua et al. | 257/14 |

FOREIGN PATENT DOCUMENTS

| | | |
|---|---|---|
| JP | 2002-359255 A | 12/2002 |
| JP | 2004-342810 A | 12/2004 |
| JP | 2005-268493 A | 9/2005 |
| JP | 2006-032524 A | 2/2006 |
| JP | 2006-513122 A | 4/2006 |
| JP | 2006-147663 A | 6/2006 |
| JP | 2006-269862 A | 10/2006 |
| JP | 2006-278857 A | 10/2006 |
| WO | 2004-061923 A1 | 7/2004 |
| WO | 2004/066393 A1 | 8/2004 |
| WO | 2006/110204 A2 | 10/2006 |

OTHER PUBLICATIONS

M. Kanamura et al; "A 100-W High-Gain AIGaN/GaN HEMT Power Amplifier on a Conductive N-SiC Subsbrate for Wireless Base Station Applications"; Electron Devices Meeting, 2004. IEDM Technical Digest. IEEE International, pp. 799-802 (2004).

Yifeng Wu et al; "High-power GaN HEMTs battle for vacuum-tube territory"; (Online), Compound Semiconductor.net, Jan./Feb. 2006, URL: http://compoundsemiconductor.net/articles/magazine/12/1/4/1.

Japanese Office Action dated Jan. 12, 2010, Application No. 2007-038905.

Japanese Office Action dated Apr. 21, 2009, Application No. 2007-038905.

Japanese Office Action dated Jan. 8, 2013, issued in corresponding Japanese Patent Application No. 2010-090507, with Partial English translation (5 pages).

* cited by examiner

COMPOUND SEMICONDUCTOR DEVICE AND METHOD OF MANUFACTURING THE SAME

CROSS-REFERENCE TO RELATED APPLICATION

This application is based upon and claims the benefit of priority from the prior Japanese Patent Application No. 2007-038905 filed on Feb. 20, 2007, the entire contents of which are incorporated herein by reference.

BACKGROUND OF THE INVENTION

1. Field of the Invention

The present invention relates to a compound semiconductor device and a method of manufacturing the same.

2. Description of Related Art

Recently, development of an electron device has been performed actively in which, on a substrate made of sapphire, silicon carbide (SiC), gallium nitride (GaN), silicon (Si) and the like, the crystal growth of an aluminum gallium nitride (AlGaN)/GaN hetero structure is performed and a GaN layer is included as an electron transit layer. For example, a high electron mobility transistor (HEMT) is known as such an electron device. The band gap of GaN is 3.4 eV and is large compared with 1.4 eV of GaAs. Because of this, GaN is expected as a semiconductor material that can realize a high breakdown voltage electron device.

High voltage operation is demanded in an amplifier for a base station of a mobile telephone. Because of this, the HEMT used in the amplifier for a base station is required to be high voltage operation. So far, a value exceeding 300 V has been reported as the breakdown voltage when the current of a GaN-HEMT is off.

Further, the most preferable output characteristic of a GaN-HEMT is currently obtained in the case of using a SiC substrate as the substrate. This is because SiC is superior in thermal conductivity.

However, the cost of a semi-insulating SiC substrate used as a substrate of a high frequency device is very high with the reason that the control of insulation properties is difficult, etc. Because of this, there is a possibility that the spread of GaN-HEMT may be hindered if the semi-insulation SiC substrate is used. Then, as a counter-measure, a conductive SiC substrate is considered for use as the substrate of GaN-HEMT. The conductive SiC substrate is developed proactively for use in an optical device or a low frequency-high output electron device as an objective, mass production and an increase in the diameter have been already realized, and it can be obtained less expensively compared with the semi-insulating SiC substrate.

In order to use the conductive SiC substrate as the substrate of a high frequency device however, there is a necessity to secure a sufficient distance between the conductive SiC substrate and an active layer from the viewpoint of insulation properties and capacity that determine the high frequency performance. Therefore, a relatively thick buffer layer made of a high resistance crystal such as AlN has been inserted between the conductive SiC substrate and the active layer.

A hydride vapor phase epitaxy (HVPE) method etc., is used in the formation of an AlN layer used as the buffer layer between the conductive SiC substrate and the active layer. According to the HVPE method, it is possible to grow a thick AlN layer with high speed and with low cost.

However, a large unevenness is often generated on the growth surface of the AlN layer formed with the HVPE method. In the case of forming a compound semiconductor layer containing a GaN layer on an AlN layer having a surface with such large unevenness and configuring an electron device such as HEMT, sufficient device characteristics can not be obtained.

FIG. 1 is a time chart showing the transient response of the conventional GaN-HEMT using the GaN layer in which Fe is added as an electron transit layer.

Drain voltage $V_D$, gate voltage $V_G$, drain current $I_D$ (Fe:GaN) in the case of using the GaN layer in which Fe is added as the electron transit layer, an ideal drain current $I_D$ (ideal) are shown.

When a fixed drain voltage $V_D$ and a rectangular pulse-shaped gate voltage $V_G$ are applied, an ideal drain current $I_D$ (ideal) becomes a rectangular plus-shaped waveform corresponding to the rectangular plus-shaped gate voltage $V_G$.

However, an interaction between defect state forming by Fe impurity and an electron occurs in the GaN layer in the case of making the GaN layer in which Fe is added to the electron transit layer. As a result, a drain current $I_D$ (Fe:GaN) becomes a waveform that decreases with time against the gate voltage $V_G$ of the rectangular shaped pulse. In such case of making the GaN layer in which Fe is added as the electron transit layer as such, a transient response is caused by defect state forming by Fe impurity, and the drain current $I_D$ (Fe:GaN) decreases with time.

SUMMARY OF THE INVENTION

According to one aspect of an embodiment, a compound semiconductor device has a buffer layer formed on a conductive SiC substrate, an $Al_xGa_{1-x}N$ layer formed on the buffer layer in which an impurity for reducing carrier concentration from an unintentionally doped donor impurity, is added and in which the Al composition x is $0 \leq x \leq 1$, a GaN-based carrier transit layer formed on the $Al_xGa_{1-N}$ layer, a carrier supply layer formed on the carrier transit layer, a source electrode and a drain electrode formed on the carrier supply layer, and a gate electrode formed on the carrier supply layer between the source electrode and the drain electrode.

According to another aspect of an embodiment, a method of manufacturing a compound semiconductor device in the present invention includes: forming a buffer layer on the conductive SiC substrate; forming an $Al_xGa_{1-x}N$ layer on the buffer layer in which an impurity for reducing carrier concentration from an unintentionally doped donor impurity is added and in which the Al composition x is $0 \leq x \leq 1$, forming a GaN-based carrier transit layer on the $Al_xGa_{1-x}N$ layer; forming the carrier supply layer on the carrier transit layer; forming the source electrode and the drain electrode on the carrier supply layer; forming a gate electrode on the carrier supply layer between the source electrode and the drain electrode.

DESCRIPTION OF THE PREFERRED EMBODIMENTS

Figure 1:
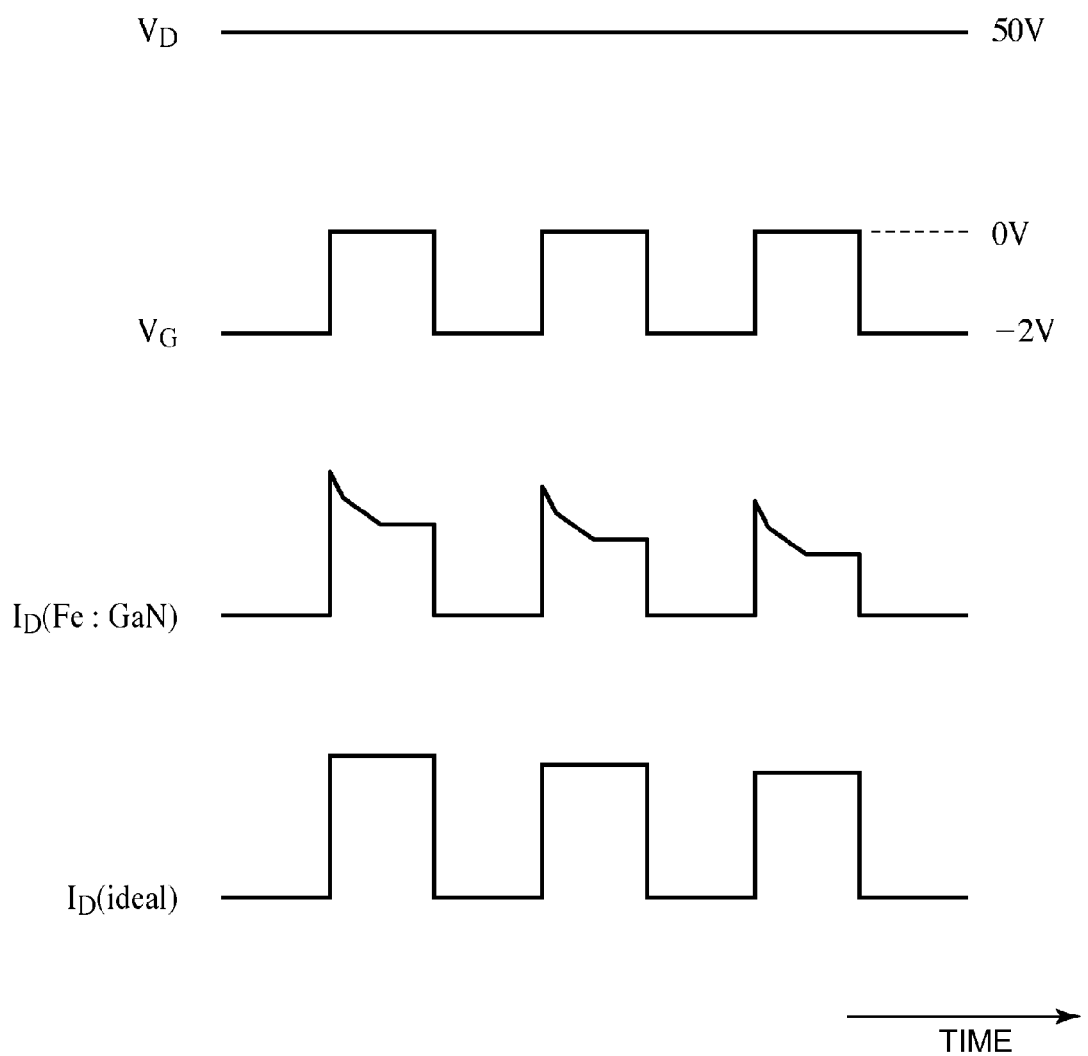
FIG. 1 is a time chart explaining a transient response in conventional GaN-HEMT having a GaN layer in which Fe is added as an electron transit layer.
Figure 2:
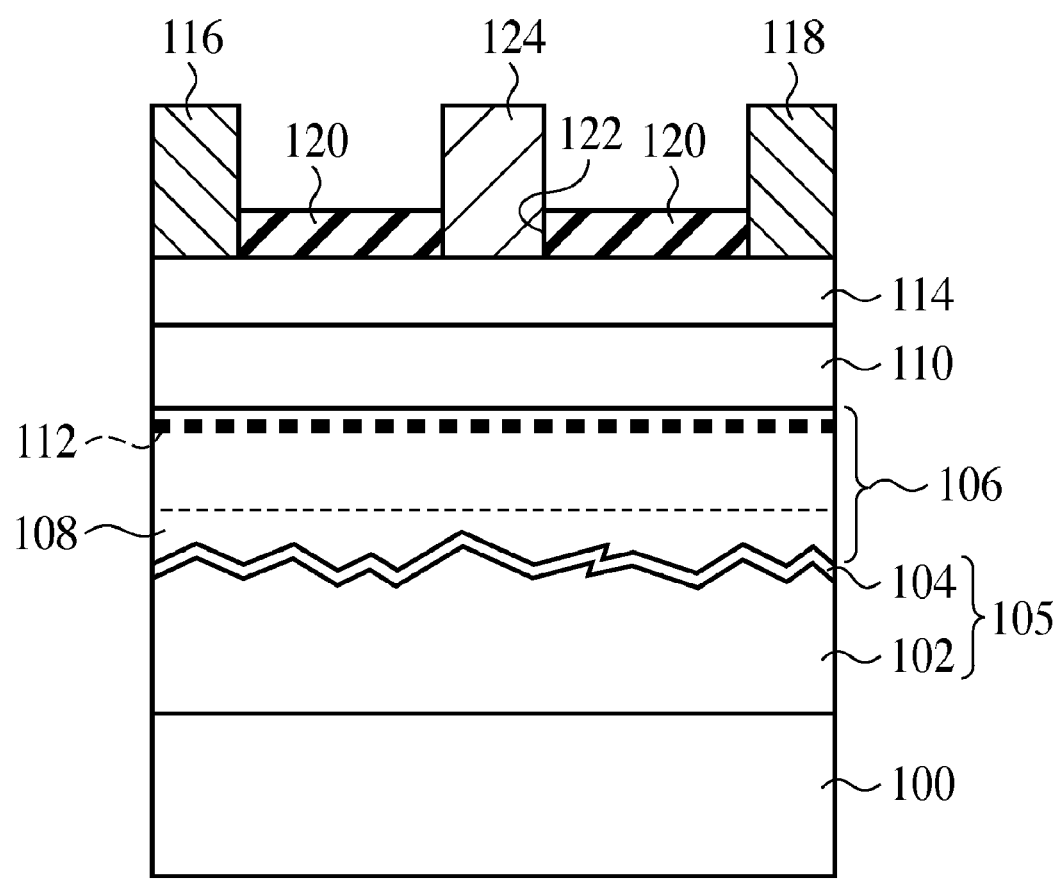
FIG. 2 is a sectional drawing showing the structure of the GaN-HEMT in which a GaN layer is simply formed on an AlN buffer layer.

FIG. 2 is a structure of the GaN-HEMT in which a GaN layer is simply formed on an AlN buffer layer.

As shown in the figure, an undoped i-type AlN buffer layer 102 of 25 μm thickness is formed on a single crystal n-type conductive SiC substrate 100. The i-type AlN buffer layer 102 is, as described later, formed with an HVPE method, and a large unevenness is generated on its surface.

An undoped i-type AlN layer 104 of 0.1 μm thickness or less, specifically about 50 nm thickness, is formed on the i-type AlN buffer layer 102. Because of the large unevenness on the surface of the i-type AlN buffer layer 120, a large unevenness is generated also on the surface of the relatively thin i-type AlN layer 104.

In this way, a buffer layer 105 composed of the i-type AlN buffer layer 102 and the i-type AlN layer 104 is formed on the n-type conductive SiC substrate 100.

An undoped i-type GaN layer 106 of 1 to 2 μm thickness is formed on the i-type AlN layer 104. A low resistance layer 108 is unintentionally formed in the lower part of the i-type GaN layer 106. The low resistance layer 108 is described later.

An n-type and/or undoped i-type AlGaN layer 110 of 20 to 30 nm thickness is formed on the i-type GaN layer 106.

The i-type GaN layer 106 functions as an electron transit layer, and the AlGaN layer 110 functions as an electron supply layer. A two dimensional electron gas 112 is formed at near the interface of the i-type GaN layer 106 with the AlGaN layer 110.

An n-type GaN cap layer 114 of 3 to 8 nm thickness is formed on the AlGaN layer 110.

A source electrode 116 and a drain electrode 118 are ohmic-contact on the n-type GaN cap layer 114 or on the GaN-etched AlGaN layer 110. The source electrode 116 and the drain electrode 118 are configured with a Ti/Al film obtained by layering a Ti film and an Al film one by one.

A silicon nitride film (SiN film) 120 is formed on the n-type GaN cap layer 114 between the source electrode 116 and the drain electrode 118. An opening part 122 reaching the n-type GaN cap layer 114 is formed in the SiN film 120. A gate electrode 124 is Schottky-contact on the n-type GaN cap layer 114 through the opening part 122. The gate electrode 124 is configured with a Ni/Au film obtained by layering a Ni film and an Au film one by one.

In this way, GaN-HEMT having the i-type GaN layer 106 that functions as the electron transit layer and the AlGaN layer 110 that functions as the electron supply layer is configured.

Moreover, the adjacent GaN-HEMT elements are separated by an inter-element isolation region (not shown) reaching the i-type GaN layer 106 piercing through the n-type GaN cap layer 114 and the AlGaN layer 110. The inter-element isolation region is configured with an insulation film buried in a groove reaching the i-type GaN layer 106 piercing through the n-type GaN cap layer 114 and the AlGaN layer 110.

The HEMT shown in the above-described FIG. 2 is manufactured as follows.

First, the i-type AlN buffer layer 102 of 25 μm thickness is grown on the single crystal n-type conductive SiC substrate 100 with the HVPE method. The growth condition of the i-type AlN buffer layer 102 is that trimethyl aluminum, ammonium gas, and HCl gas are used as raw material, the growth pressure is set to normal pressure, and the growth speed is set to 100 μm/h. A crystal face having a large unevenness is frequently generated on the growth surface of the i-type AlN buffer layer formed with the HVPE method.

Next, the i-type AlN layer 104 of 50 nm thickness, the i-type GaN layer 106 of 1 to 2 μm thickness, the n-type and/or undoped i-type AlGaN layer 110 of 20 to 30 nm thickness, and the n-type GaN cap layer 114 of 3 to 8 nm thickness are grown one by one on the i-type AlN buffer layer 102 with a reduced pressure type metal organic chemical vapor deposition (MOCVD) method.

The growth condition of these compound semiconductor layers with the reduced pressure type MOCVD method is that trimethyl aluminum with hydrogen and/or nitrogen gas, trimethyl gallium with hydrogen and/or nitrogen gas, and ammonium gas are used as raw material, whether the supply of trimethyl aluminum that is an Al source and/or trimethyl gallium that is a Ga source are/is needed or not and the flow rate are appropriately set depending on the growing compound semiconductor layer. The flow rate of ammonium gas that is a common raw material is set to 100 ccm to 10 LM. Further, the growth pressure is set to 50 to 300 Torr, and the growth temperature is set to 1000 to 1200° C. When the n-type AlGaN layer 110 and the n-type GaN cap layer 114 are grown, diluted $SiH_4$ is supplied at a few ccm together with other raw material gasses, and Si is added at a carrier concentration of $1\times10^{18}$ to $5\times10^{18}/cm^3$ in the n-type AlGaN layer 110 and the n-type GaN cap layer 114 as an impurity.

In the growth of the compound semiconductor layers, the i-type GaN layer 106 takes in a large amount of conductive impurities such as Si included in the raw material gas, that constitute donor impurities. At this time, when the i-type GaN layer 106 is grown on the i-type AlN buffer layer 102 having a surface with a large unevenness, the low resistance layer 108 having a high concentration of the donor impurities is formed in the lower part of the i-type GaN layer 106, that is the part near the interface of the i-type AlN buffer layer 102 in the i-type GaN layer 106 caused by the large unevenness of its surface.

Next, the source electrode 116 and the drain electrode 118 composed of a Ti/Al film are formed in a fixed region on the n-type GaN cap layer 114 with a patterning, evaporating and lift-off method.

Then, the SiN film 120 is deposited on the entire face of the n-type GaN cap layer 114 with a plasma CVD method.

The opening part 122 reaching the n-type GaN cap layer 114 is formed on the SiN film 120 with photolithography and dry-etching.

The gate electrode 124 composed of a Ni/Au film is formed on the n-type GaN cap layer 114 through the opening part 122 with a patterning, evaporating and lift-off method.

In this way, the GaN-HEMT shown in FIG. 2 is manufactured.

The inventors of the present invention made the following points clear by experimentally evaluating the device characteristics of the GaN-HEMT shown in FIG. 2 manufactured as described above.

First, the inventors of the present invention made it clear that it is difficult that a very large off state current flows, that is to make a transistor off, in the GaN-HEMT shown in FIG. 2.

Figure 3:
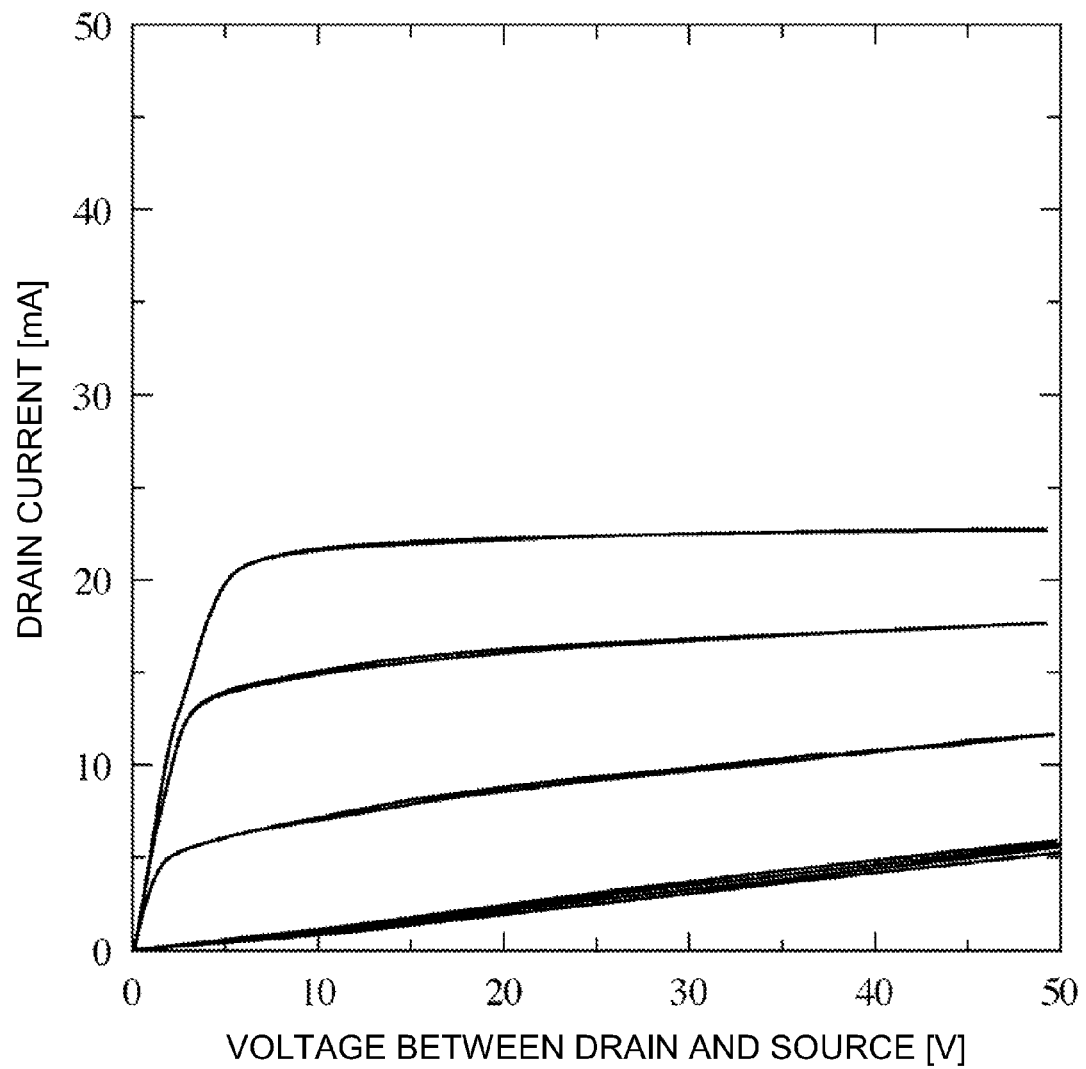
FIGS. 3 and 4 are graphs showing device characteristics of the GaN-HEMT shown in FIG. 2.

FIG. 3 is a graph showing three-terminal current voltage characteristics of the GaN-HEMT shown in FIG. 2.

In the measurement of the three-terminal current voltage characteristics, the drain voltage and the drain current are measured when the source is connected to the ground, and the gate voltage is set from +2 V to −3 V with a 1 V step. The x-axis of the graph shows the voltage between the drain and the source, and the y-axis shows the drain current. The current voltage curve in the graph is obtained as following. The gate voltage is set to be constant, the drain current is measured as the drain voltage is swept from zero to 50 V. And, gate voltage is sequentially changed as 2 V, 1 V, 0 V, −1 V, −2 V, −3 V, same measurement of drain current are performed.

In this case, the curves of −1 V, −2 V, and −3 V appear almost as they are lying on the top of each other.

As clear from the graph shown in FIG. 3, a very large drain current is also flowing in the case where the gate voltage is −3 V. A drain current of as much as 5 mA is flowing at a drain-source voltage of 50 V. From this result, it is recognized that it is difficult to turn off the transistor in the GaN-HEMT shown in FIG. 2.

Further, the inventors of the present invention made it clear that it is difficult to sufficiently separate the adjacent elements electrically, and therefore, in some cases, normal operation is hindered by carriers flowing into one element from the adjacent element in the GaN-HEMT shown in FIG. 2.

Figure 4:
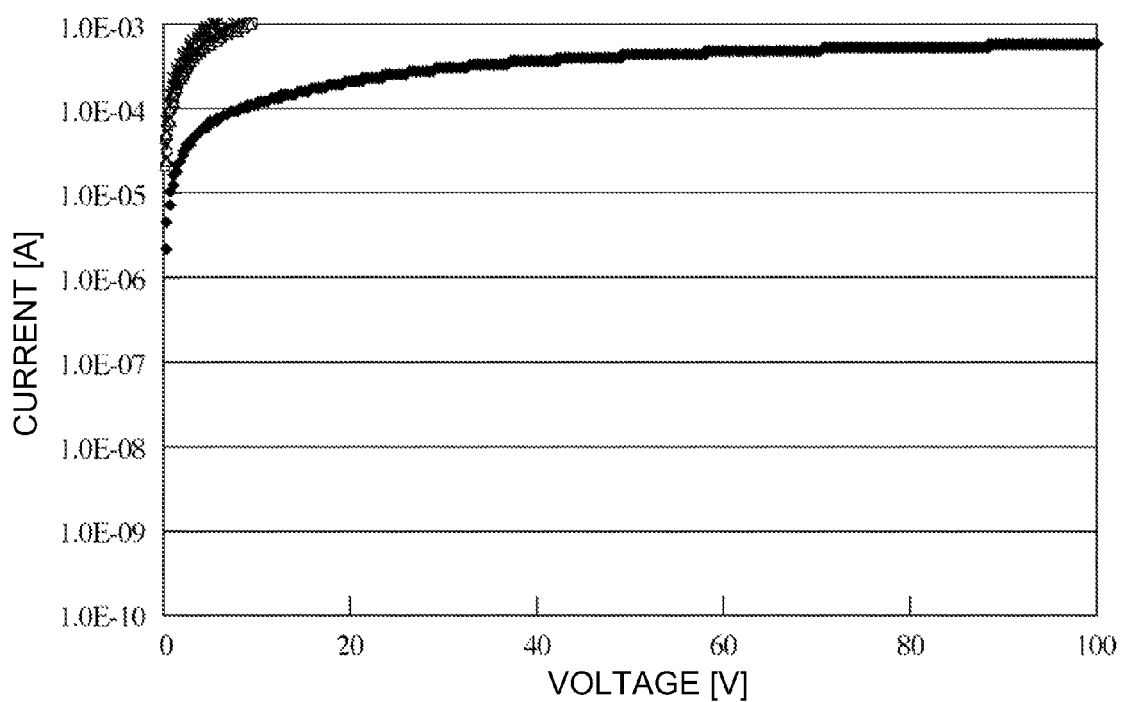

FIG. 4 is a graph showing a current voltage characteristic used in the evaluation of the inter-element isolation resistance of the GaN-HEMT shown in FIG. 2. In the measurement of this current voltage characteristic, a voltage is applied between the drain of one HEMT and the source of the other HEMT of two adjacent HEMTs separated by the inter-element isolation region, and a current flowing therebetween is measured. The x-axis of the graph shows the voltage, and the y-axis shows the current. A few of curves in FIG. 10 correspond to similar measurement for different elements.

As clear from the graph shown in FIG. 4, in the case that a voltage of 100 V is applied between the drain of one element and the source of the other element of two adjacent HEMT elements separated by the inter-element isolation region, a large leakage current reaching about $1.0 \times 10^{-3}$ A is flowing. To prevent from excess current flowing into element, the limitation of current is set to $1.0 \times 10^{-3}$ A. From this result, in the GaN-HEMT shown in FIG. 2, it is found that a high inter-element isolation resistance cannot be obtained, and that it is difficult to sufficiently separate the adjacent elements electrically. When the separation between the adjacent elements is not sufficient in such way, carriers flow into one element from the other element and normal operation of one element comes to be hindered.

As described above, in the HEMT shown in FIG. 2, as very large current in an off state flows, it is difficult to obtain a high inter-element isolation resistance, and good device characteristics cannot be obtained. Such device characteristics are caused by the low resistance layer 108 easily formed in the lower part of the i-type GaN layer 106 when the i-type GaN layer 106 is formed on the i-type AlN buffer layer 102 having a surface with a large unevenness.

As shown in the above-described FIG. 2, when the i-type GaN layer 106 is grown on the i-type AlN buffer layer 102 having a surface with a large unevenness formed with the HVPE method etc., caused by the large unevenness of its surface, the low resistance layer 108 with a high concentration of unintentionally doped donor impurities such as Si is formed in the lower part of the i-type GaN layer 108. In this way, because the low resistance layer 108 formed in the lower part of the i-type GaN layer 106 exists, good device characteristics cannot be obtained in the GaN-HEMT shown in FIG. 2.

Figure 5:
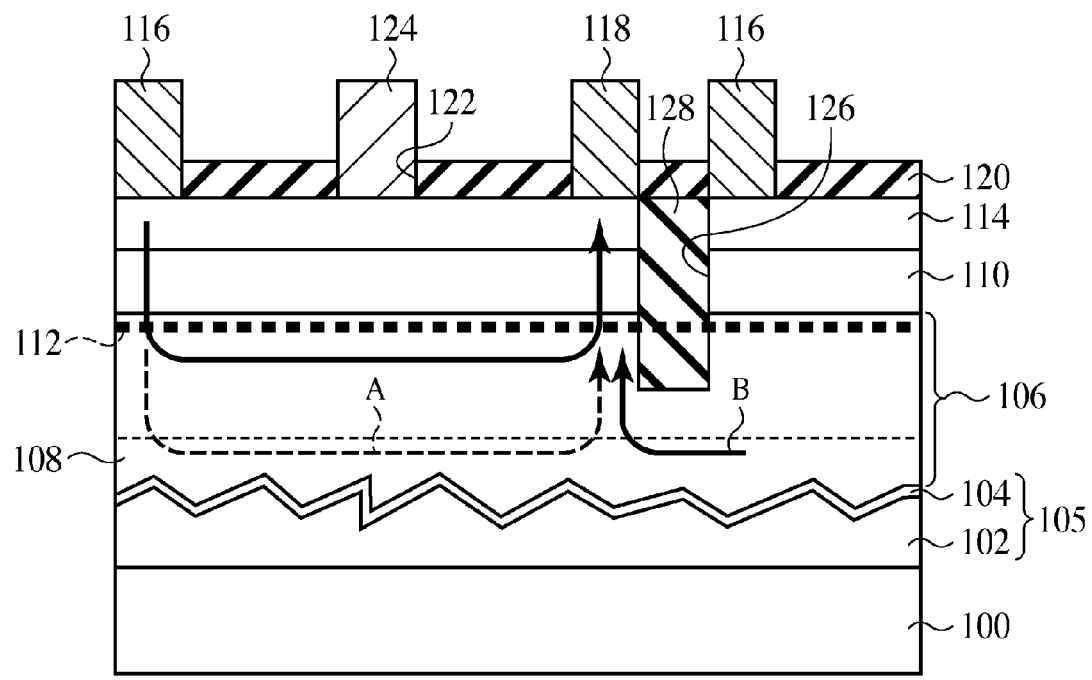
FIG. 5 is a sectional drawing explaining device characteristics of the GaN-HEMT shown in FIG. 2.

With reference to FIG. 5, description will be given to deterioration of the device characteristics by the low resistance layer 108 formed in the lower part of the i-type GaN layer 106.

First, when a crystal layer having a high carrier concentration, that is the low resistance layer 108, is formed in the lower part of the i-type GaN layer 106, a depletion layer generated by the gate voltage to turn the transistor off cannot be extended to the low resistance layer 108. Because of this, even when the gate voltage to turn the transistor off is applied, a current flows between the drain and the source through the low resistance layer 108 as shown with an arrow A in FIG. 5. The reason that the current in an off state is large in the GaN-HEMT shown in FIG. 2, is because of the current flowing through the low resistance layer 108 in such way.

Further, the GaN-HEMT elements are separated by an inter-element isolation region 128 composed of an insulation film buried in a groove 126 reaching the i-type GaN layer 106 piercing through the n-type GaN cap layer 114 and the AlGaN layer 110 as shown in FIG. 5. Between the elements that are adjacent to such inter-element isolation region 128, the carriers flow into one element from the other element through the low resistance layer 108 formed in the lower part of the i-type GaN layer 106. Because of this, as shown with an arrow B in FIG. 5, a leakage current flows between the elements. The low inter-element isolation resistance in the GaN-HEMT shown in FIG. 2 is also caused by the low resistance layer 108 in the i-type GaN layer 106.

The inventors of the present invention achieved the idea of a compound semiconductor device in which the formation of a low resistance layer that leads the deterioration of the device characteristics on the GaN-based compound semiconductor layer is avoided and superior device characteristics can be realized and a method of manufacturing the same in the case of using a conductive SiC substrate. Below, the compound semiconductor device and its manufacturing method in the present invention are described in detail.

Figure 6:
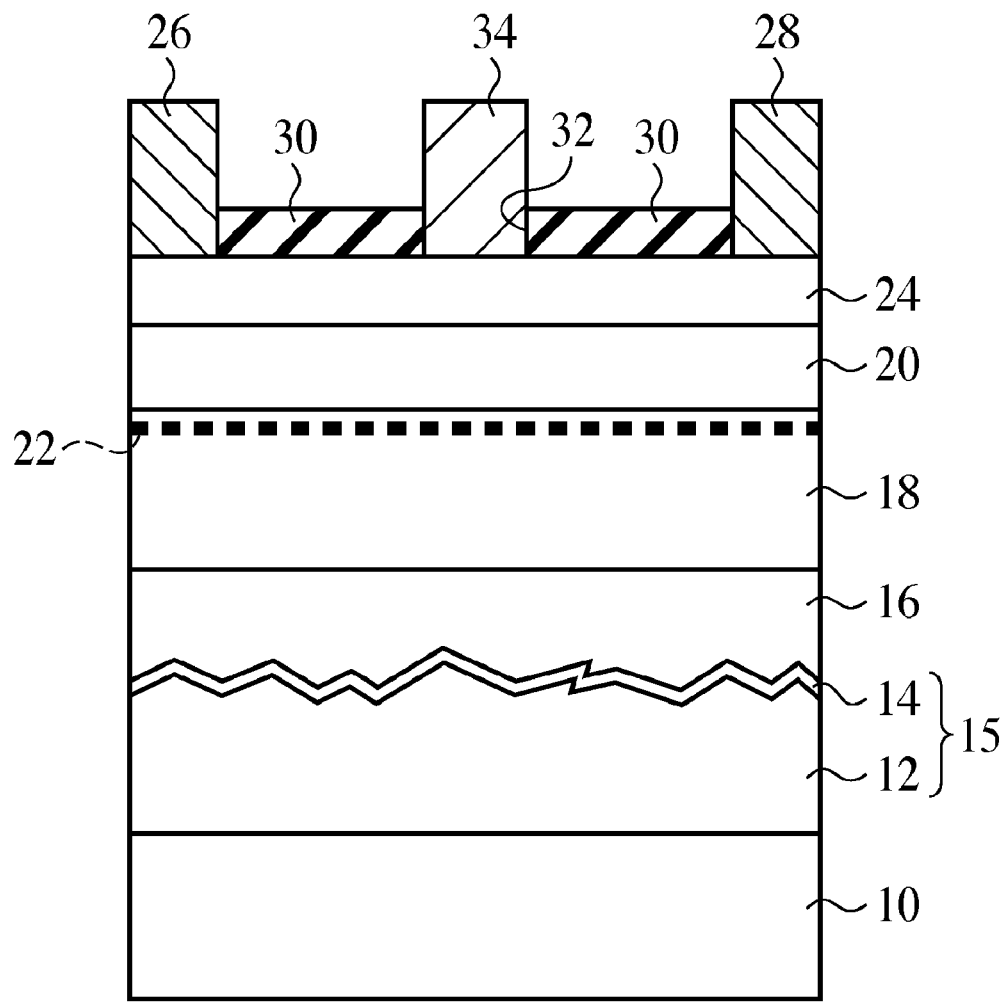
FIG. 6 is a sectional drawing showing a structure of the compound semiconductor device according to a first embodiment of the present invention.

FIG. 6 is a structure of the compound semiconductor device in the present embodiment.

The compound semiconductor device in the present invention is a GaN-HEMT using a less expensive conductive SiC substrate compared with a semi-insulating SiC substrate.

As shown in FIG. 6, an undoped i-type AlN buffer layer 12 of 25 μm thickness for example is formed on a single crystal n-type conductive SiC substrate 10. The i-type AlN buffer layer 12 functions as an insulator layer insulating between the n-type conductive substrate 10 and a compound semiconductor layer containing an i-type GaN layer 18 described later. The i-type AlN buffer layer 12 is formed with the HVPE method for example, and a large unevenness is generated on its surface as described later.

Figure 7:
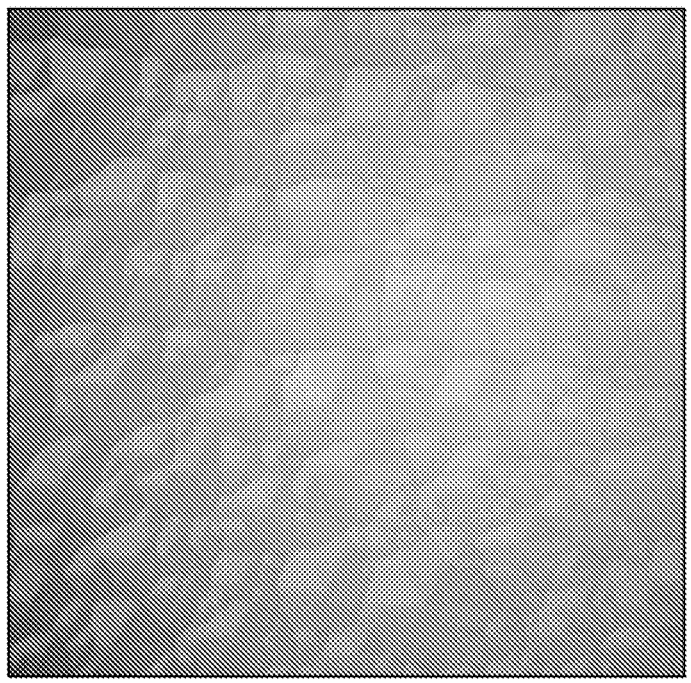
FIGS. 7, 8A and 8B are drawings showing a result of observing a surface of an AlN layer formed with an HVPE method.
Figure 8A:
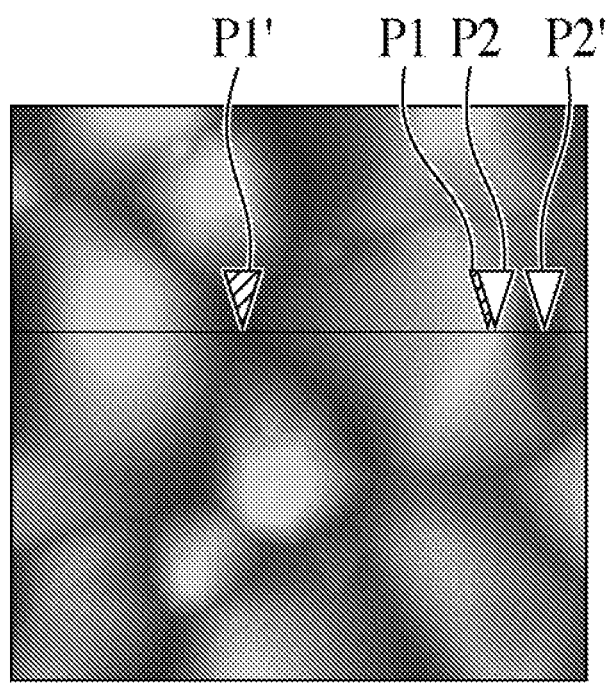
Figure 8B:
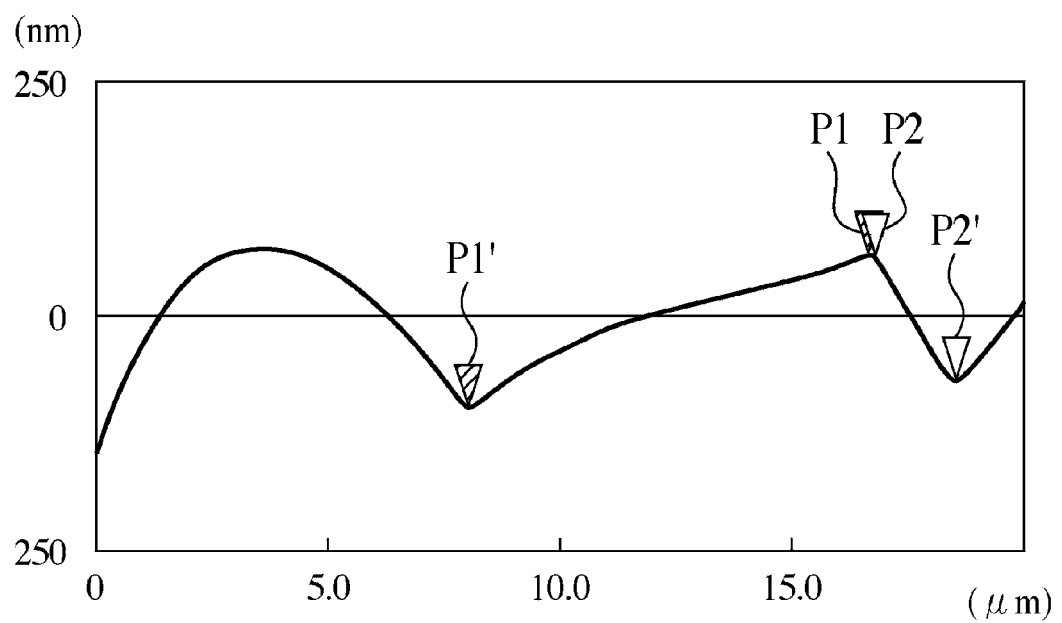

FIG. 7 is an optical microscope image showing the result of observing the surface of the AlN layer formed with the HVPE method. Further, FIG. 8A is an atomic force microscope image showing the result of observing the surface of the AlN layer formed with the HVPE method. FIG. 8B is a drawing showing a cross-section along an A-A' line in FIG. 8A. The AlN layer used in the surface observation is grown with the HVPE method using trimethyl aluminum, ammonium gas, and HCl gas as raw material gases and setting the growth pressure to normal pressure and the growth speed to 100 µm/h.

As shown in FIG. 7 and FIGS. 8A and 8B, a large unevenness is generated on the surface of the AlN layer formed with the HVPE method. For example, the distance of the perpendicular direction (level difference) between the points represented with an inverse triangle in the atomic force microscope image of FIG. 8A is 163.97 nm between a point P1 and a point P1', and it is 130.77 nm between a point P2 and a point P2'.

In this way, the i-type AlN buffer layer 12 has a surface with a large unevenness.

An undoped i-type AlN layer 14 of 0.1 µm thickness or less for example, specifically 20 to 50 nm thickness for example, is formed on the i-type AlN buffer layer 12 as shown in FIG. 6. Because of the large unevenness of the surface of the i-type AlN buffer layer 12, a large unevenness is generated also on a surface of the relatively thin i-type AlN layer 14. In contrast to the i-type AlN buffer layer 12 formed with the HVPE method, the i-type AlN layer 14 is formed with the MOCVD method for example as described later.

In this way, a buffer layer 15 composed of the i-type AlN buffer layer 12 and the i-type AlN layer 14 is formed on the n-type conductive SiC substrate 10.

A GaN buffer layer 16 of 0.5 µm thickness for example and in which Fe that is a transition metal element is added as an impurity is formed on the i-type AlN layer 14. Fe is added to the GaN buffer layer 16 at a concentration of $1 \times 10^{18}$ to $1 \times 10^{20}/cm^3$ for example. The GaN buffer layer 16 is formed relatively thick, and its surface is almost level, even when it is formed on the i-type AlN buffer layer 12 having a surface with a large unevenness.

An undoped i-type GaN layer 18 of 1 to 2 µm thickness for example is formed on the GaN buffer layer 16. Moreover, Fe is not added in the i-type GaN layer 18 being different from the GaN buffer layer 16.

An n-type and/or undoped i-type AlGaN layer 20 of 20 to 30 nm thickness for example is formed on the i-type GaN layer 18.

The i-type GaN layer 18 functions as an electron transit layer, and the AlGaN layer 20 functions as an electron supply layer. A two dimensional electron gas 22 is formed near the interface of the i-type GaN layer 18 with the AlGaN layer 20. Moreover, the thickness of the i-type GaN layer 18 is desirably at least 0.5 µm or more so that two dimensional electron gas generated in the i-type GaN layer 18 does not receive any influence of Fe added to the GaN buffer layer 16.

An n-type GaN cap layer 24 of 3 to 8 nm thickness for example is formed on the AlGaN layer 20.

A source electrode 26 and a drain electrode 28 are ohmic-contact on the n-type GaN cap layer 24 or on the GaN-etched AlGaN layer 20. The source electrode 26 and the drain electrode 28 are configured with a Ti/Al film in which a Ti film and an Al film are layered one by one.

A silicon nitride film (SiN film) 30 is formed on the n-type GaN cap layer 24 between the source electrode 26 and the drain electrode 28 as a surface protective film. An opening part 32 reaching the n-type GaN cap layer 24 is formed in the SiN film 30. A gate electrode 34 is Shottoky-contact through the opening part 32 on the n-type GaN cap layer 24. The gate electrode 34 is configured with a Ni/Au film in which a Ni film and an Au film are layered one by one.

In this way, the GaN-HEMT having the i-type GaN layer 18 that functions as the electron transit layer and the AlGaN layer 20 that functions as the electron supply layer is configured.

Moreover, adjacent GaN-HEMT elements are separated by an inter-element isolation region (not shown) reaching the i-type GaN layer 18 piercing through the n-type GaN cap layer 24 and the AlGaN layer 20. The inter-element isolation region is configured with an insulation film buried in a groove reaching the i-type GaN layer 18 piercing through the n-type GaN cap layer 24 and the AlGaN layer 20.

The compound semiconductor device of the present embodiment is formed on the i-type AlN buffer layer 12 having a surface with a large unevenness and under the i-type GaN layer 18, and there is a main characteristic that it has the GaN buffer layer 16 in which Fe that is a transition metal element is added.

As described above, in the GaN-HEMT shown in FIG. 2, donor impurities such as Si are taken into the i-type GaN layer 108 when the i-type GaN layer 108 is grown, and the low resistance layer 108 is formed in the lower part of the i-type GaN layer 108. Because of this low resistance layer 108, in the GaN-HEMT shown in FIG. 2, the current in the off state is large, and good device characteristics such as a low inter-element isolation resistance cannot be obtained.

In contrast to this, in the compound semiconductor device of the present embodiment, Fe that is a transition metal element added to the GaN buffer layer 16 compensates the carrier from the donor impurities such as Si taken into the GaN buffer layer 16 when the GaN buffer layer 16 is grown. Because of this, the carrier concentration in the GaN buffer layer 16 is reduced. Therefore even if the GaN buffer layer 16 is formed on the i-type AlN buffer layer 12 having a surface with a large unevenness, formation of the low resistance layer in the GaN buffer layer 16 can be avoided.

Further, the GaN buffer layer 16 is formed relatively thick, and its surface is almost level even if it is formed on the i-type AlN buffer layer 12 having a surface with a large unevenness. The i-type GaN layer 18 that functions as an electron transit layer is formed on the GaN buffer layer 16 in which the surface is almost level in such a manner, so that formation of the low resistance layer in the i-type GaN layer 18 is also avoided.

Therefore, according to the present embodiment, in the case of using the relatively less expensive conductive SiC substrate 10 compared with the semi-insulating SiC substrate, a GaN-HEMT that is superior in device characteristics can be realized.

Figure 9:
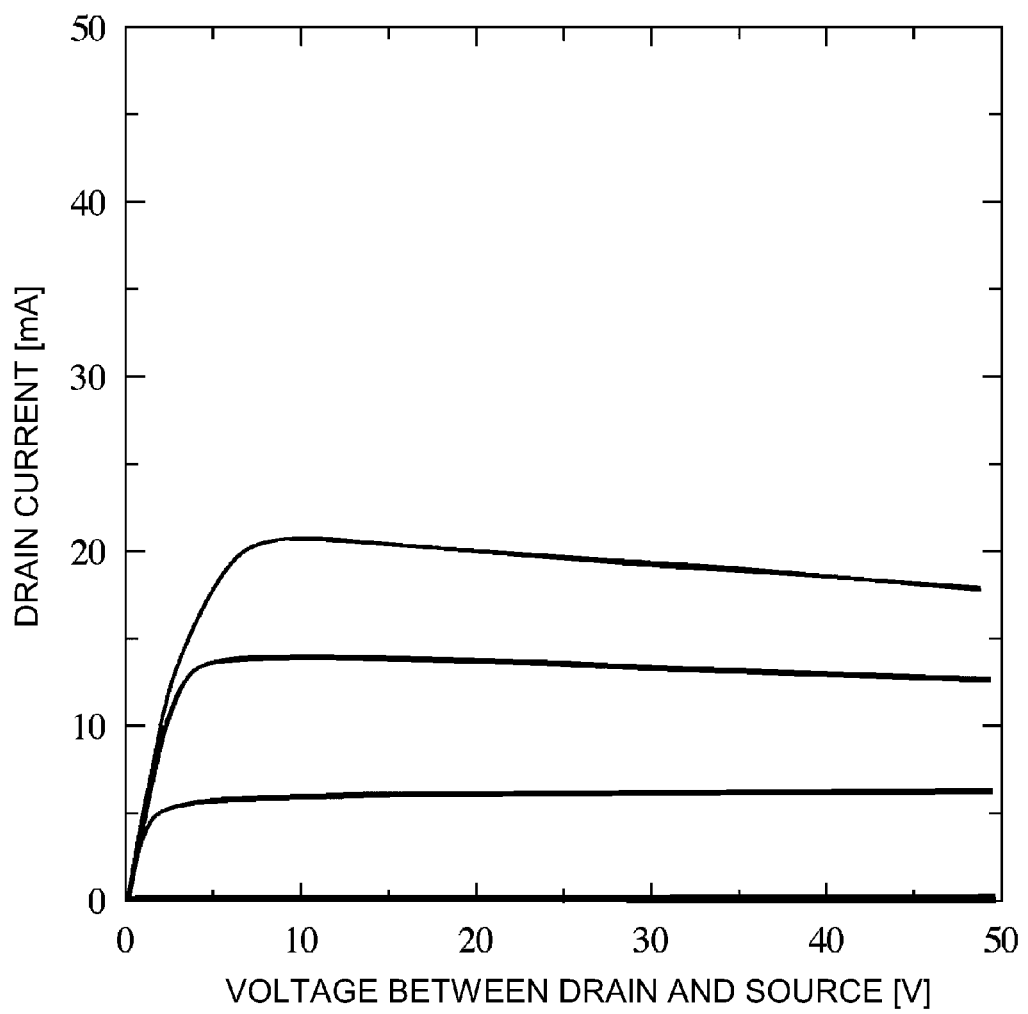
FIGS. 9 and 10 are graphs showing device characteristics of the compound semiconductor device according to the first embodiment of the present invention.

FIG. 9 is a graph showing the three-terminal current voltage characteristics of the compound semiconductor device of the present embodiment.

In the measurement of the three-terminal current voltage characteristics, a drain voltage and a drain current are measured when a source is connected to a ground, and a gate voltage is set from +2 V to −3 V with a 1 V step. The x-axis of the graph shows a voltage between the drain and the source, and the y-axis shows the drain current. The current voltage curve in the graph is obtained as following. The gate voltage is set to be constant, the drain current is measured as the drain voltage is swept from zero to 50 V. And, gate voltage is sequentially changed as 2 V, 1 V, 0 V, −1 V, −2 V, −3 V, same measurement of drain current are performed.

As is clear from the graph shown in FIG. 9, the drain current becomes almost zero in the case that the gate voltage is −1 V or less in the compound semiconductor device of the present embodiment. From this result, it is found that the current in the off state is sufficiently decreased in the compound semiconductor device of the present embodiment and that it has a superior off performance.

Figure 10:
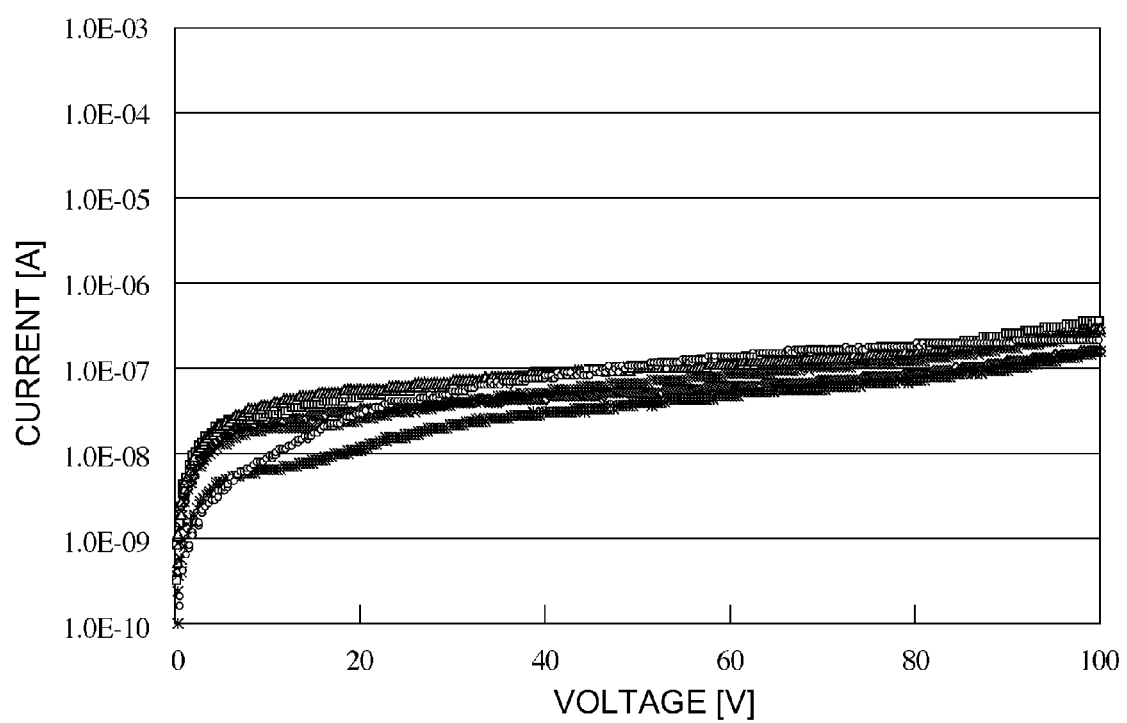

Further, FIG. 10 is a graph showing current voltage characteristic used in the evaluation of the inter-element isolation resistance of the compound semiconductor device of the present embodiment. In the measurement of this current voltage characteristic, a voltage is applied between the drain of one HEMT and the source of the other HEMT of two adjacent HEMTs separated by an inter-element isolation region, and the current flowing between these is measured. The x-axis of the graph shows the voltage, and the y-axis shows the current. A few of curves in FIG. 10 correspond to similar measurement for different elements.

As seen from the graph shown in FIG. 10, in the present embodiment, a current flowing between the drain of one HEMT and the source of the other HEMT of two adjacent HEMTs separated by an inter-element isolation region is reduced to $1.0 \times 10^{-6}$ A or less. This value is about $1/1000$ or less of the case that the GaN layer in which Fe is added shown in FIG. 4 is not formed. From this result, it is seen that a sufficiently high inter-element isolation resistance is obtained.

In such a manner, in the compound semiconductor device of the present embodiment, formation of the low resistance layer in the GaN buffer layer 16 and the i-type GaN layer 18 is also avoided. Thus, the current in the off state is sufficiently decreased and sufficiently high inter-element isolation resistance is obtained.

Moreover, an unevenness in which the level difference is as large as 130 nm for example is generated on the surface of the i-type AlN buffer layer 12 formed with the HVPE method as shown in FIG. 8A. Therefore, in order to certainly avoid the low resistance layer from forming by leveling the unevenness due to the i-type AlN buffer layer 12, the thickness of the GaN buffer layer 16 in which Fe is added is desirably 0.2 μm or more.

Further, the concentration of Fe added in the GaN buffer layer 16 is desirably a higher concentration than the donor impurities contained in the GaN buffer layer 16. The concentration of Fe is made to be $1.0 \times 10^{18}$ to $1.0 \times 10^{20}/cm^3$.

Further, it is desirable that the average thickness of a buffer layer 15 (the i-type AlN buffer layer 12 and the i-type AlN layer 14) formed between the n-type conductive SiC substrate 10 and the i-type GaN layer 18 is 10 μm or more, and more preferably 15 μm or more. By forming the buffer layer 15 at such average thickness, a sufficient gain can be obtained in a GaN-HEMT power amplifier using a conductive SiC substrate.

Figure 11:
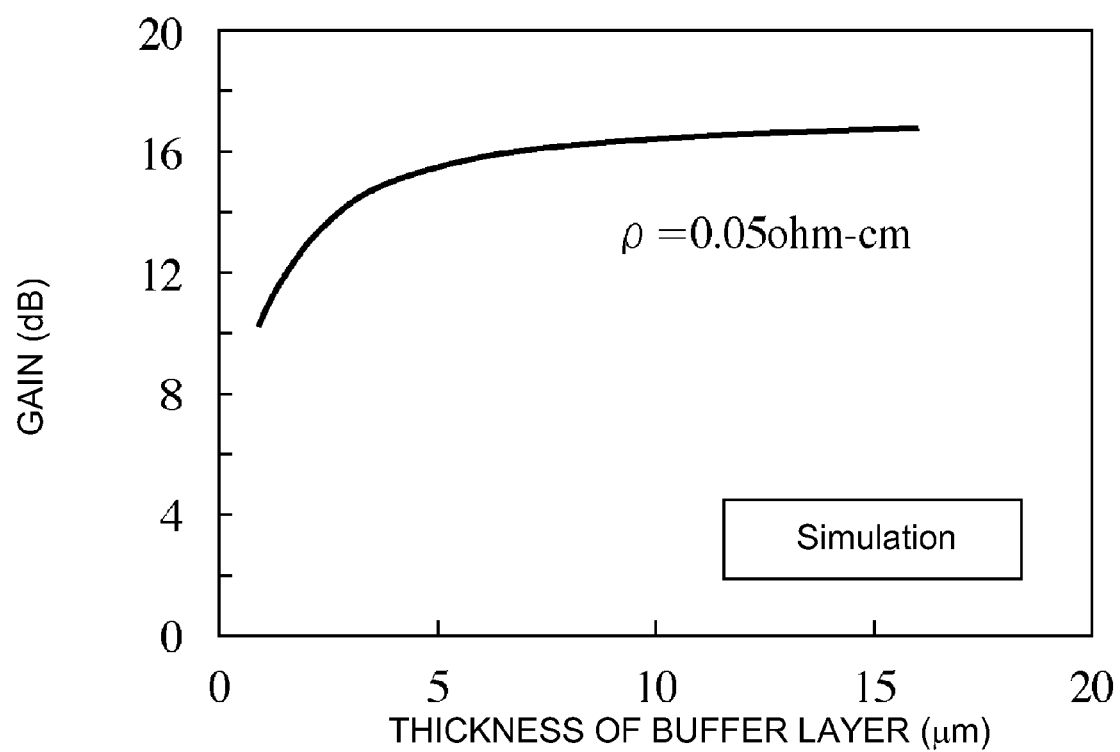
FIG. 11 is a graph showing the relationship of the gain of GaN-HEMT and the thickness of the AlN buffer layer.

FIG. 11 is a graph showing the relationship of the gain of the GaN-HEMT power amplifier and the thickness of the buffer layer 15. The graph shown in FIG. 11 is obtained by performing a simulation of an equivalent circuit with device parameters extracted from the GaN-HEMT using a semi-insulating SiC substrate, in which a parasitic element caused by the substrate is added. In the simulation, a change in the gain is corresponding to a change in the thickness of the buffer layer formed between the n-type conductive SiC substrate and an active region in the case that the resistance of the n-type conductive SiC substrate is 0.05 Ωcm. The x-axis of the graph shows the thickness of the buffer layer, and the y-axis shows the gain.

As clear from the graph shown in FIG. 11, when the thickness of the buffer layer becomes 10 μm or more, and more preferably 15 μm or more, it becomes possible to ignore the parasitic component that causes a decrease of the gain in the case that the thickness of the buffer layer is thin, and that a sufficient gain can be obtained.

In the conventional GaN-HEMT in which the GaN layer in which Fe is added is made to be an electron transit layer, an interaction occurs between defect state forming by Fe impurity in the GaN layer and an electron. As a result, a drain current $I_D$ (Fe:GaN) becomes a wave shape that is decreasing with time against a gate voltage $V_G$ of a rectangular shape. In this way, in the case that the GaN layer in which Fe is added is made to be as an electron transit layer, the transient response is induced by Fe, and the drain current $I_D$ (Fe:GaN) is decreasing with time.

In contrast to this, in the compound semiconductor device of the present embodiment, the i-type GaN layer 18 that functions as an electron transit layer is formed on the GaN buffer layer 16 in which Fe is added. Fe is not added in this i-type GaN layer 18. Further, the thickness of the i-type GaN layer 18 is set at least 0.5 μm or more. Hereby, two dimensional electron gas generated in the i-type GaN layer 18 does not receive any influence of Fe added to the GaN buffer layer 16. Therefore, in the compound semiconductor device of the present embodiment, the transient response such as the conventional configuration using the GaN layer in which Fe is added as an electron transit layer can be avoided, and the drain current can be prevented from decreasing with time.

FIGS. 12A-12J are step cross-sectional drawings of a method of manufacturing a compound semiconductor device of the present embodiment.

Figure 12A:
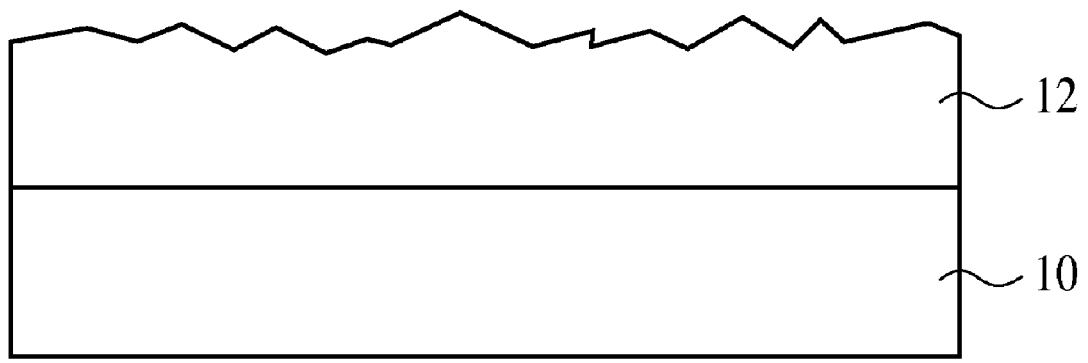
FIGS. 12A to 12J are step sectional drawings showing a method of manufacturing a compound semiconductor device according to the first embodiment of the present invention.

First, the i-type AlN buffer layer 12 of 25 μm thickness for example is grown on the single crystal n-type conductive SiC substrate 10 with the HVPE method for example (FIG. 12A). The growth condition of the i-type AlN buffer layer 12 is that trimethyl aluminum, ammonium gas, and HCl gas are used as raw material gases, the growth pressure is set to normal pressure, and the growth speed is set to 100 μm/h.

Figure 12B:
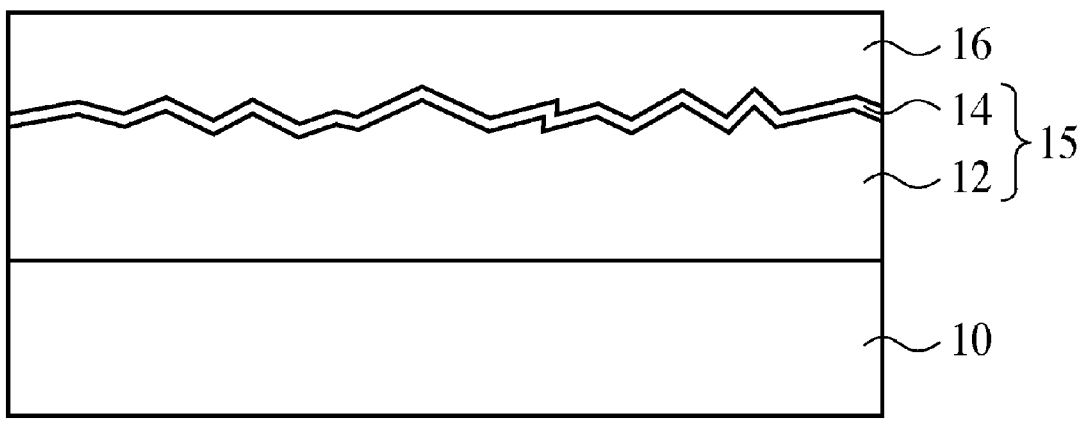
Figure 12C:
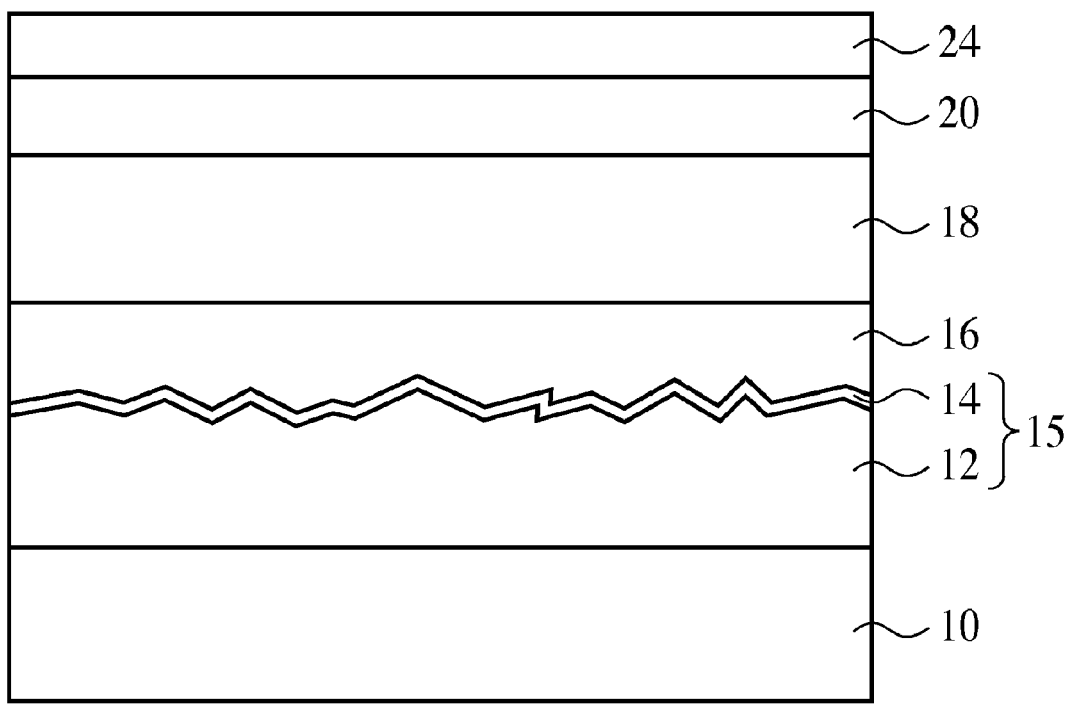

Next, the relatively thin i-type AlN layer 14 of 50 nm thickness for example, the GaN buffer layer 16 of 0.5 μm thickness for example in which Fe is added, the i-type GaN layer 18 of 1 to 2 μm thickness for example, the n-type AlGaN layer 20 of 20 to 30 nm thickness for example, and the n-type GaN cap layer 24 of 3 to 8 nm thickness for example are grown one by one on the i-type AlN buffer layer 12 with the reduced pressure-type MOCVD method (FIGS. 12B and 12C).

The growth condition of these compound semiconductor devices with the reduced pressure-type MOCVD method is that trimethyl aluminum with hydrogen and/or nitrogen gas, trimethyl gallium with hydrogen and/or nitrogen gas, and ammonium gas are used as raw material gases, whether the supply of trimethyl aluminum that is an Al source and/or trimethyl gallium that is a Ga source are/is needed or not and the flow rate are appropriately set depending on the growing compound semiconductor layer. The flow rate of ammonium gas that is a common raw material is set to 100 ccm to 10 LM. Further, the growth pressure is set to 50 to 300 Torr, and the growth temperature is set to 1000 to 1200° C.

Further, when the GaN buffer layer 16 in which Fe is added is grown, an organic metal raw material containing Fe such as ferrocene together with other raw material gasses is supplied, and Fe is added to the GaN buffer layer 16 for example at a concentration of $1 \times 10^{18}$ to $1 \times 10^{20}/cm^3$ for example.

Further, when the n-type AlGaN layer 20 and the n-type GaN cap layer 24 are grown, diluted $SiH_4$ is supplied at a few ccm together with other raw material gasses, and Si is added to the n-type AlGaN layer 20 and the n-type GaN cap layer 24 at a carrier concentration of $1\times10^{18}$ to $5\times10^{18}/cm^3$ as impurities. With this, electrical characteristics of the GaN-HEMT are controlled.

Figure 12D:
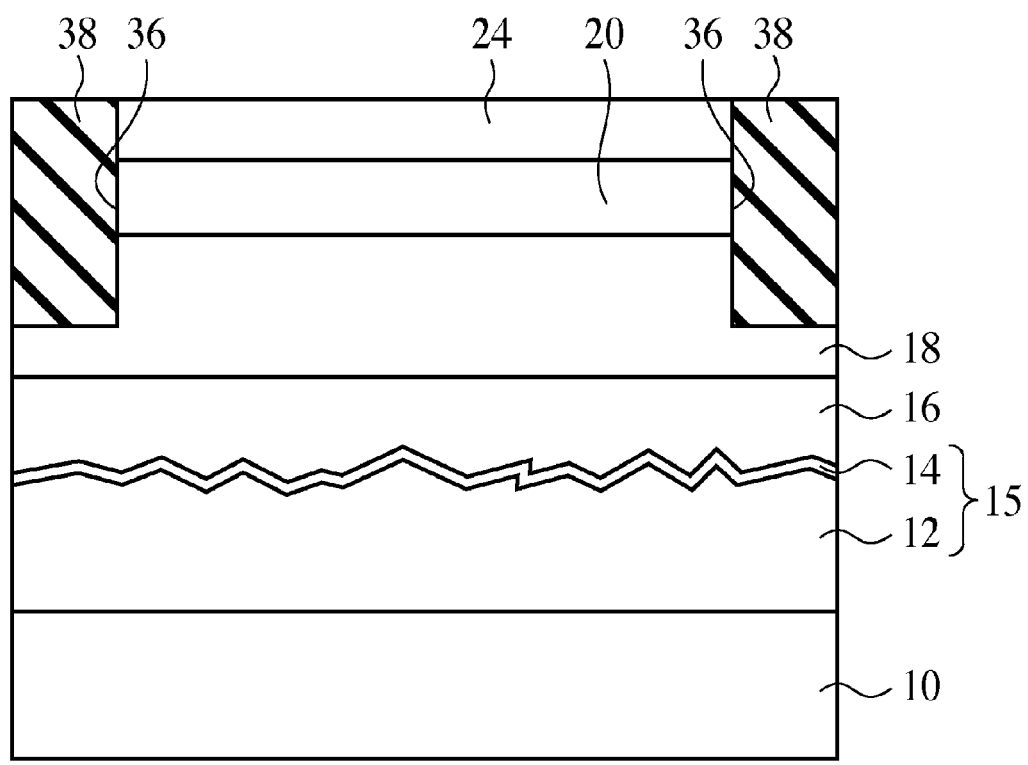

Next, a groove 36 reaching to the i-type GaN layer 18 piercing through the n-type GaN cap layer 24 and the n-type AlGaN layer 20 is formed with photolithography and etching. Then, an inter-element isolation region 38 composed of an insulation film is formed by burying the insulation film in this groove 36 with the plasma CVD method (FIG. 12D). Moreover, the inter-element isolation region may be formed with an ion implantation method.

A photo resist film (not shown) exposing a region prearranged for forming the source electrode 26 and the drain electrode 28 and covering other regions is formed on the n-type GaN cap layer 24 with photolithography.

A Ti/Al film is formed on the entire face of the n-type GaN cap layer 24 by depositing a Ti film of 20 nm thickness for example and an Al film of 200 nm thickness for example one by one with a vapor deposition method for example.

Then, the Ti/Al film on the photo resist film is removed together with the photo resist film.

Figure 12E:
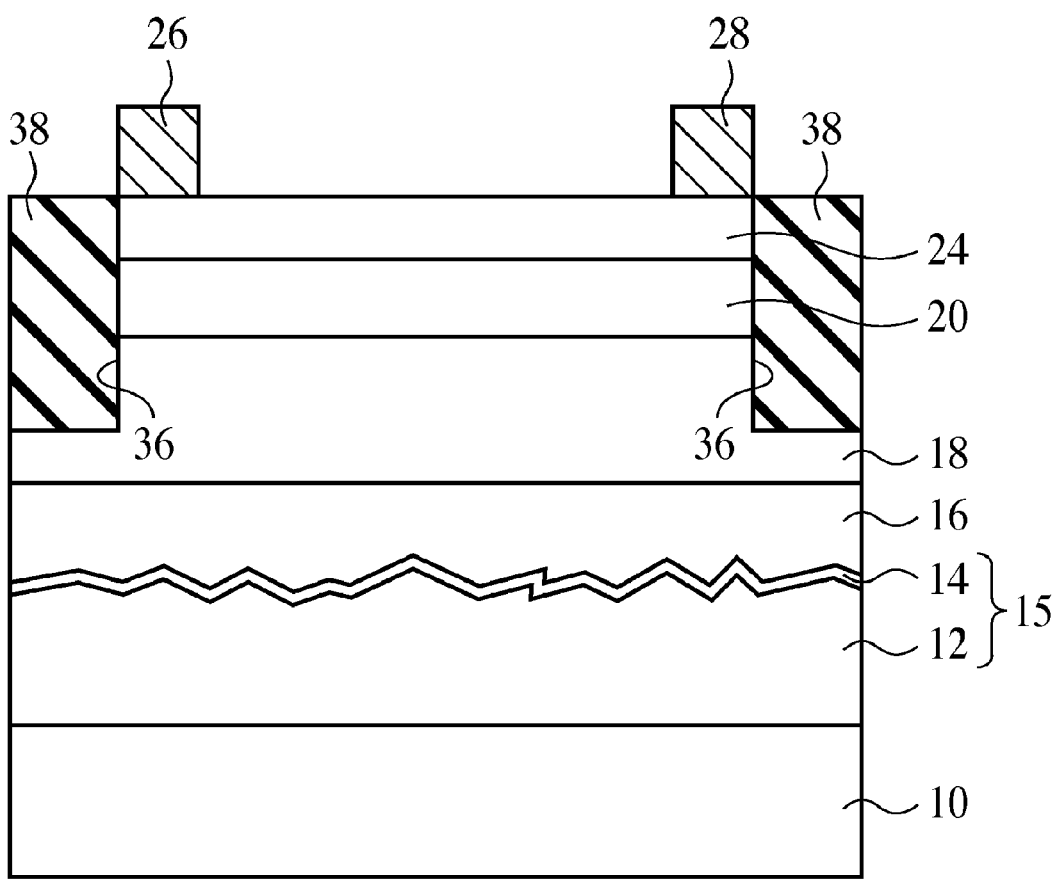

In this way, the source electrode 26 and the drain electrode 28 composed of the Ti/Au film are formed with a lift-off method (FIG. 12E).

Figure 12F:
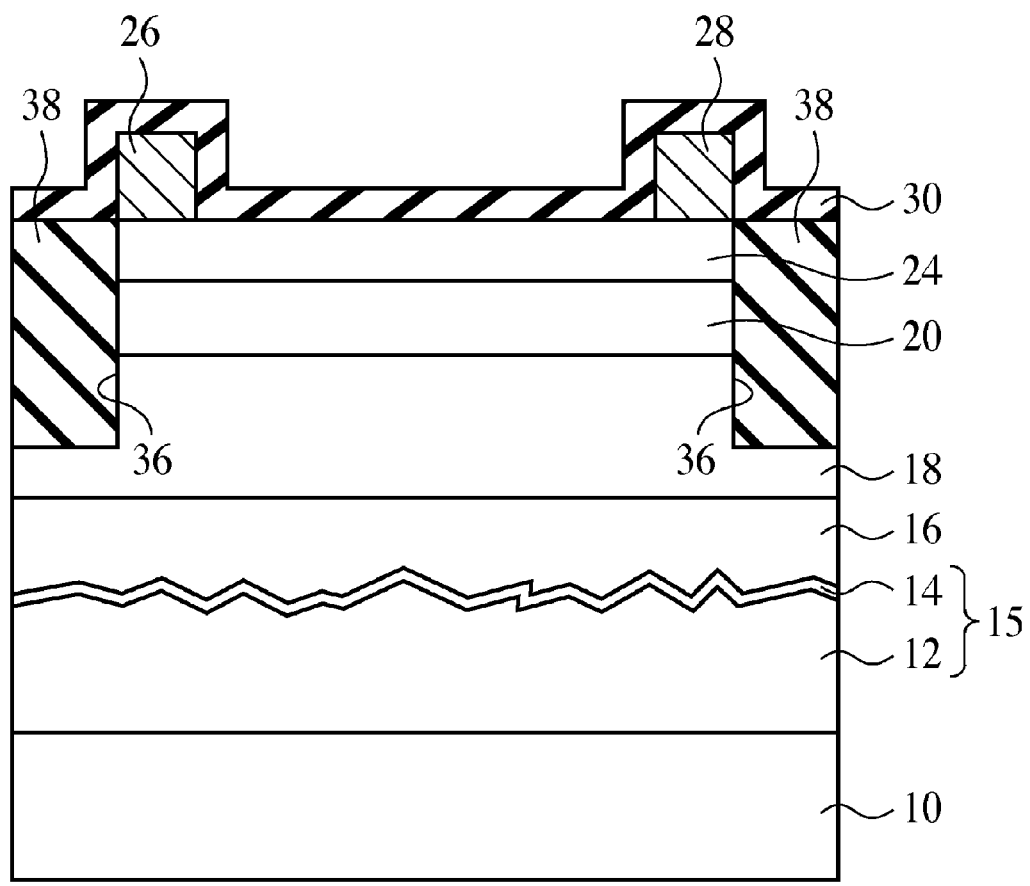

Next, a SiN film 30 is deposited on the entire surface with the plasma CVD method for example (FIG. 12F).

Figure 12G:
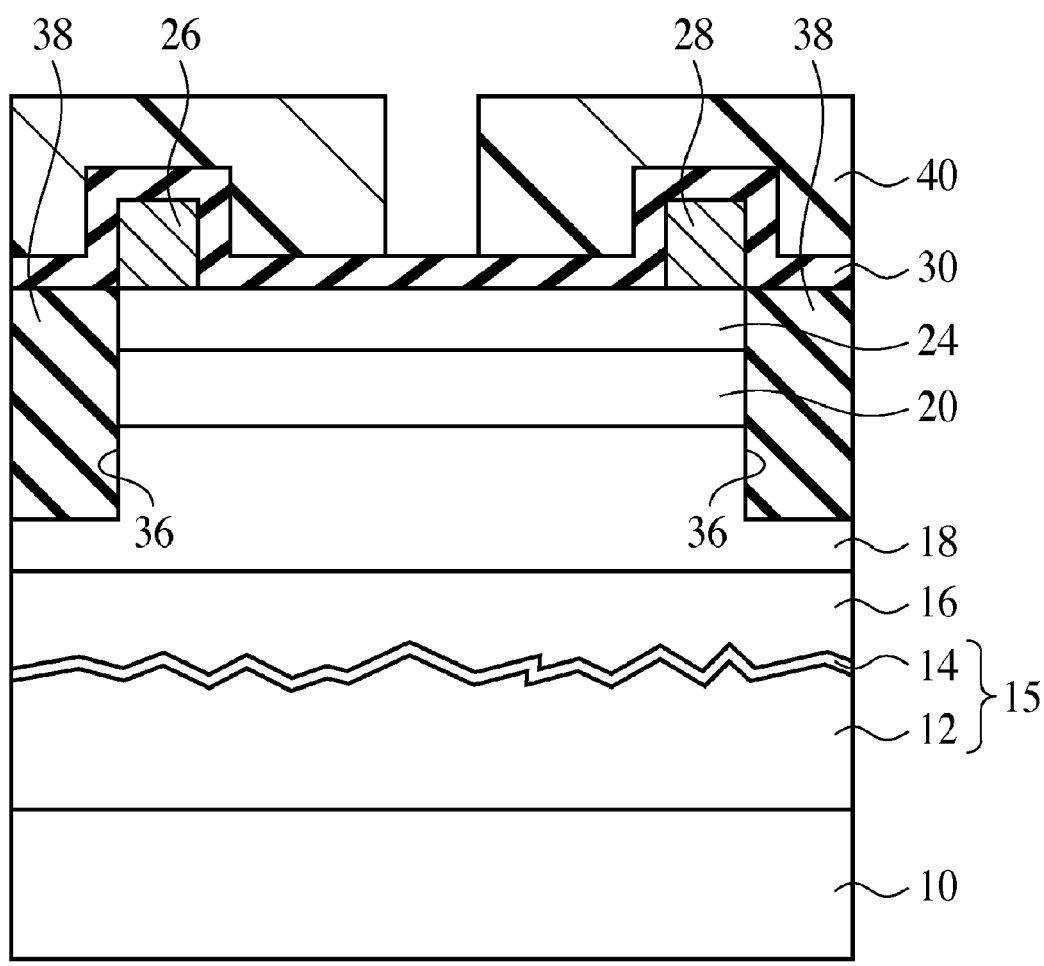

Next, a photo resist film 40 exposing a region prearranged for forming the opening part 32 and covering other regions is formed on the SiN film 30 with photolithography (FIG. 12G).

Figure 12H:
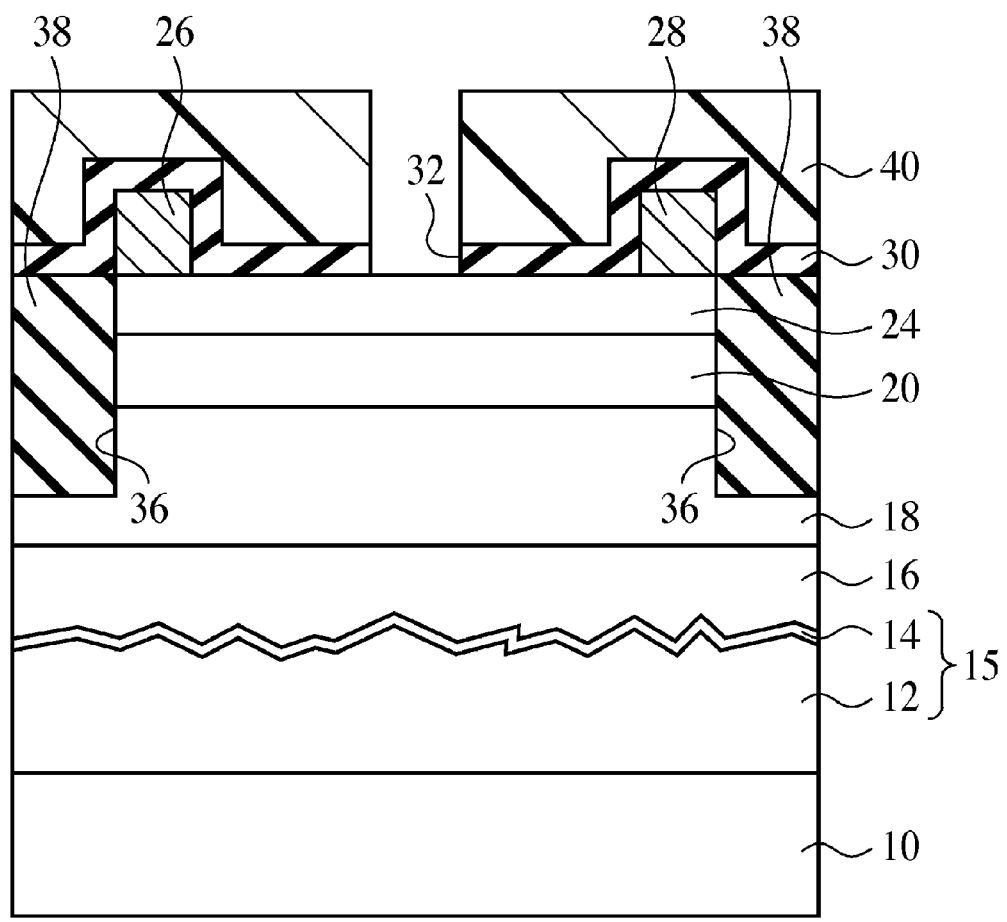

Next, the opening part 32 reaching the n-type GaN cap layer 24 is formed in the SiN film 30 by etching the SiN film 30 with the photo resist film 40 as a mask (FIG. 12H).

After forming the opening part 32, the photo resist film 40 is removed.

A photo resist film 42 exposing a region prearranged for forming the gate electrode 34 including the opening part 32 and covering other regions is formed on the SiN film 30 in which the opening part 32 is formed with photolithography.

Figure 12I:
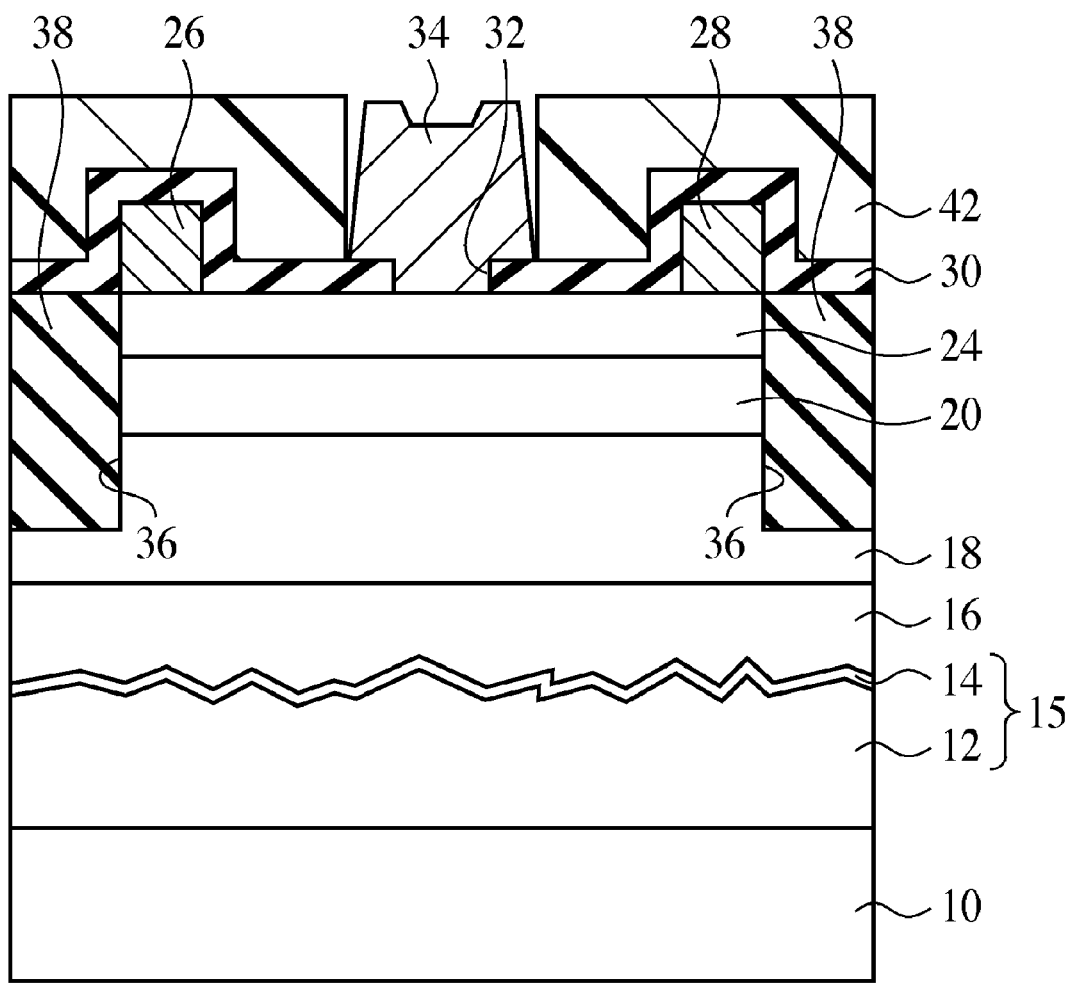
Figure 12J:
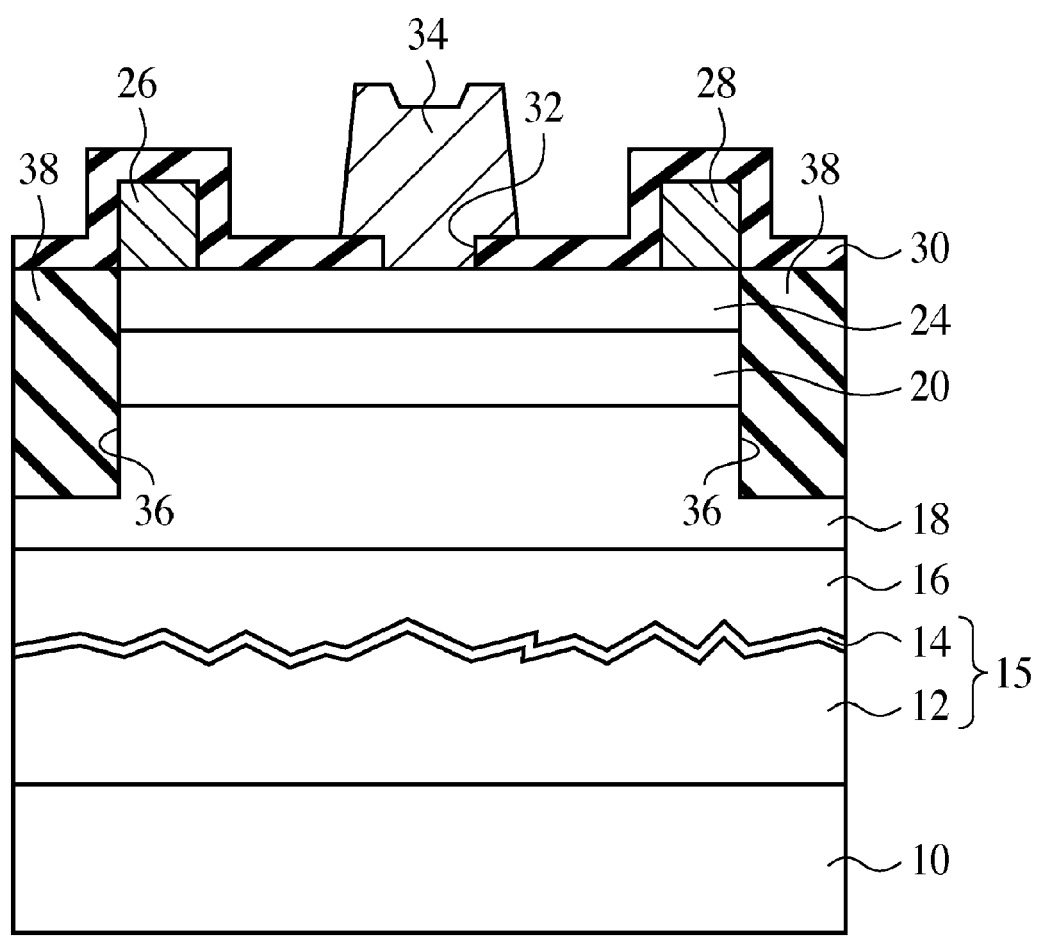
Figure 13:
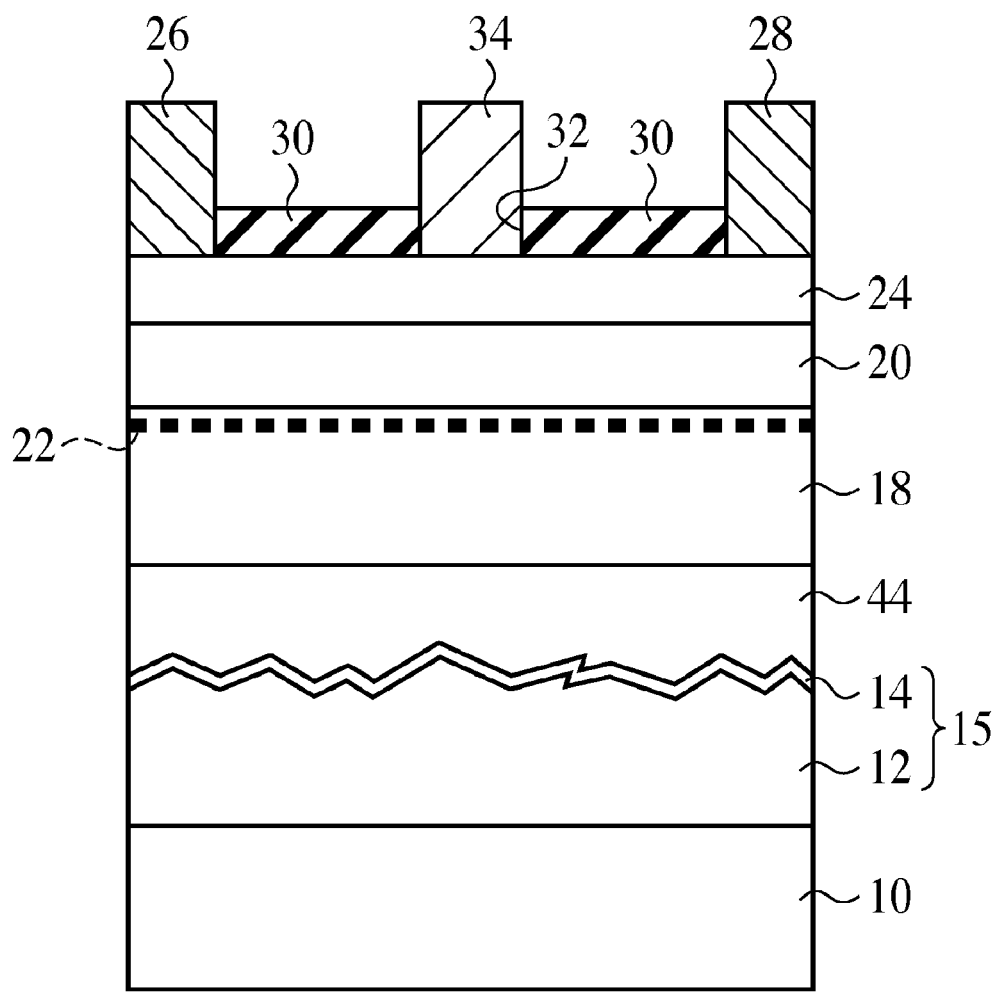
FIG. 13 is a sectional drawing showing the structure of the compound semiconductor device according to a second embodiment of the present invention.

A Ni/Au film 34 is formed on the entire face by depositing a Ni film of 10 nm thickness for example and an Au film of 300 nm thickness for example with the vapor deposition method for example (FIG. 12I).

Then, the Ni/Au film 34 on the photo resist film 42 is removed together with the photo resist film 42.

In this way, the gate electrode 34 composed of a Ni/Au film is formed with the lift-off method (FIG. 12 J).

Accordingly, the compound semiconductor device of the present embodiment is manufactured.

According to the present embodiment, the GaN buffer layer 16 in which Fe that is a transition metal element is added is formed on the i-type AlN buffer layer 12 before forming the i-type GaN layer 18 and after forming the i-type AlN buffer layer 12 having a surface with a large unevenness. This makes it possible to avoid formation of a low resistance layer in the GaN buffer layer 16 and the i-type GaN layer 18. Therefore, according to the present embodiment, a GaN-HEMT that is superior in device characteristics can be realized in the case of using a relatively less expensive conductive SiC substrate 10 compared with a semi-insulating SiC substrate.

Figure 14A:
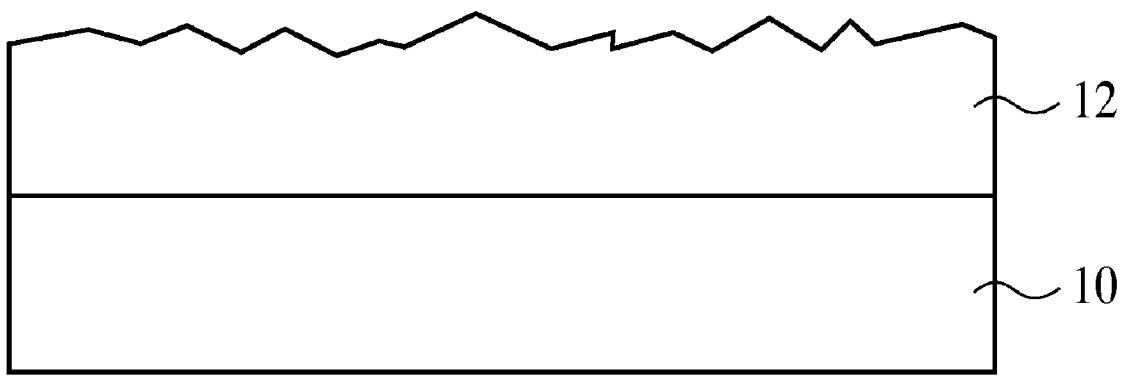
FIGS. 14A to 14C are step sectional drawings showing a method of manufacturing a compound semiconductor device according to the second embodiment of the present invention.
Figure 14B:
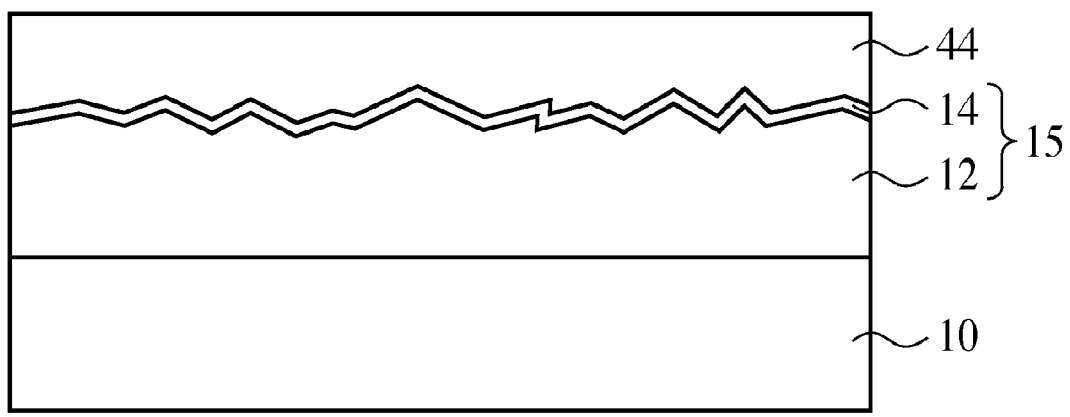
Figure 14C:
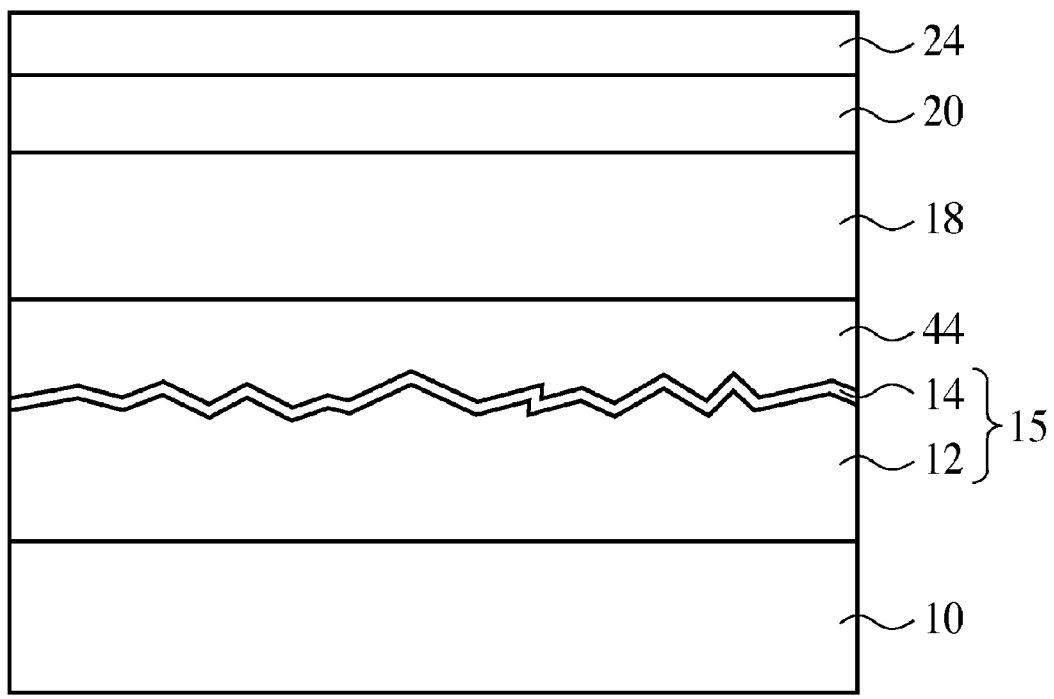

FIGS. 14A-14C show a structure of the compound semiconductor device of the second present embodiment.

The basic configuration of the compound semiconductor device of the present embodiment is almost the same as the compound semiconductor device according to the first embodiment. The compound semiconductor device of the present embodiment differs from the compound semiconductor device of the first embodiment in a point that an $Al_xGa_{1-x}N$ buffer layer 44 in which Fe is added is formed instead of the GaN buffer layer 16 in which Fe is added. See FIG. 14B.

As shown in FIG. 14B, the buffer layer 15 composed of the i-type AlN buffer layer 12 of 25 μm thickness for example and the i-type AlN layer 14 of 20 to 50 nm thickness for example is formed on the single crystal n-type conductive SiC substrate 10 the same as the compound semiconductor device of the first embodiment.

The $Al_xGa_{1-x}N$ buffer layer 44 in which Fe that is a transition metal element is added as impurities of 0.3 μm thickness for example is formed on the i-type AlN layer 14. Fe is added at a concentration of $1\times10^{18}$ to $1\times10^{20}/cm^3$ for example in the $Al_xGa_{1-x}N$ buffer layer 44. The Al composition x of the $Al_xGa_{1-x}N$ buffer layer 44 may be a value satisfying $0<x<1$. However, it is preferably a small value of 0.1 or less. This is because the control of crystal quality of AlGaN becomes difficult as the Al composition becomes larger. The $Al_xGa_{1-x}N$ buffer layer 44 is formed relatively thick, and its surface is almost level even when it is formed on the i-type AlN buffer layer 12 having a surface with a large unevenness.

The undoped i-type GaN layer 18 of 1 to 2 μm thickness for example is formed on the $Al_xGa_{1-x}N$ buffer layer 44. The thickness of the i-type GaN layer 18 is good if it is at least 0.5 μm or more. Fe is not added in the i-type GaN layer 18 being different from the $Al_xGa_{1-x}N$ buffer layer 44.

The n-type and/or undoped i-type AlGaN layer 20 of 20 to 30 nm thickness for example is formed on the i-type GaN layer 18.

The i-type GaN layer 18 functions as an electron transit layer, and the AlGaN layer 20 functions as an electron supply layer. The two dimensional electron gas layer 22 is formed near the interface of the i-type GaN layer 18 with the AlGaN layer 20.

The n-type GaN cap layer 24 of 3 to 8 nm thickness for example is formed on the AlGaN layer 20.

The gate electrode 34, the source electrode 26 and the drain electrode 28, and the SiN film 30 are formed the same as the compound semiconductor device of the first embodiment on the n-type GaN cap layer 24.

In this way, the GaN-HEMT having the i-type GaN layer 18 that functions as an electron transit layer and the AlGaN layer 20 that functions as an electron supply layer is configured.

The compound semiconductor device of the present embodiment is formed on the i-type AlN buffer layer 12 having a surface with a large unevenness and under the i-type GaN layer 18, and there is a main characteristic that it has the $Al_xGa_{1-x}N$ buffer layer 44 in which Fe that is a transition metal element is added.

In this way, in the compound semiconductor device of the present embodiment, because Fe is added in the $Al_xGa_{1-x}N$ buffer layer 44, formation of a low resistance layer can be avoided in the $Al_xGa_{1-x}N$ buffer layer 44 and the i-type GaN layer 18 the same as the compound semiconductor device of the first embodiment. Because of this, a sufficiently high inter-element isolation resistance can be obtained together with decreasing the current in the off state sufficiently.

Now, a method of manufacturing the compound semiconductor device of the present embodiment will be explained with reference to FIGS. 14A to 14C.

First, the i-type AlN buffer layer 12 of 25 μm thickness for example is grown on the single crystal n-type conductive SiC substrate 10 with the HVPE method for example in the same manner as the method of manufacturing the compound semiconductor device of the first embodiment (FIG. 14A).

Next, the relatively thin i-type AlN layer 14 of 50 nm thickness for example, the $Al_xGa_{1-x}N$ buffer layer 44 of 0.3

μm thickness for example in which Fe is added, the i-type GaN layer 18 of 1 to 2 μm thickness for example, the n-type AlGaN layer 20 of 20 to 30 nm thickness for example, and the n-type GaN cap layer 24 of 3 to 8 nm thickness for example are grown one by one on the i-type AlN buffer layer 12 with the reduced pressure-type MOCVD method (FIGS. 14B and 14C).

A growth condition of these compound semiconductor layers with the reduced pressure type MOCVD method is that trimethyl aluminum with hydrogen and/or nitrogen gas, trimethyl gallium with hydrogen and/or nitrogen gas, and ammonium gas are used as raw material gases, whether the supply of trimethyl aluminum that is an Al source and/or trimethyl gallium that is a Ga source are/is needed or not and the flow rate are appropriately set depending on the growing compound semiconductor layer. The flow rate of ammonium gas that is a common raw material is set to 100 ccm to 10 LM. Further, the growth pressure is set to 50 to 300 Torr, and the growth temperature is set to 1000 to 1200° C.

Further, when the $Al_xGa_{1-x}N$ buffer layer 44 in which Fe is added is grown, an organic metal raw material containing Fe such as ferrocene together with other raw material gasses is supplied, and Fe is added to the $Al_xGa_{1-x}N$ buffer layer 44 for example at a concentration of $1\times10^{18}$ to $1\times10^{20}/cm^3$.

Further, when the n-type AlGaN layer 20 and the n-type GaN cap layer 24 are grown, diluted $SiH_4$ is supplied at a few ccm together with other raw material gasses, and Si is added to the n-type AlGaN layer 20 and the n-type GaN cap layer 24 at a carrier concentration of $1\times10^{18}$ to $5\times10^{18}/cm^3$ as impurities. With this, electrical characteristics of the GaN-HEMT are controlled.

Since it is the same as the method of manufacturing the compound semiconductor device of the first embodiment, the explanation of the step after the n-type GaN cap layer 24 is grown is omitted.

In this way, according to the present embodiment, the $Al_xGa_{1-x}N$ buffer layer 44 in which Fe that is a transition metal element is added is formed on the i-type AlN buffer layer 12 before forming the i-type GaN layer 18 and after forming the i-type AlN buffer layer 12 having a surface with a large unevenness. This enables to avoid formation of a low resistance layer in the $Al_xGa_{1-x}N$ buffer layer 44 and the i-type GaN layer 18. Therefore, according to the present embodiment, a GaN-HEMT that is superior in device characteristics can be realized in the case of using a relatively less expensive conductive SiC substrate 10 compared with a semi-insulating SiC substrate.

The present invention is not limited to the above-described embodiments, and various modifications are possible.

For example, the above-described embodiments explain the case of forming the compound semiconductor layer containing the i-type GaN layer 18 as a carrier transit layer on the conductive SiC substrate 10. However, the present invention can be applied broadly in the case of forming a compound semiconductor layer containing a GaN-based carrier transit layer on a conductive SiC substrate. For example, the present invention can be also applied in the case of forming an InGaN layer as a carrier transit layer.

The above-described embodiments also explain the case of forming the n-type AlGaN layer 20 as a carrier supply layer. However, the carrier supply layer is not limited to the n-type AlGaN layer. An i-type AlGaN layer, an InAlN layer, or an AlInGaN layer may be formed as the carrier supply layer.

Further, the case of forming the n-type GaN layer 24 as a cap layer is explained in the above-described embodiments. However, the cap layer is not limited to the n-type GaN layer. There may be no cap layer, or an i-type GaN layer, or an i-type AlGaN layer may be formed.

Furthermore, the above-described embodiments explain the case of adding Fe in the GaN buffer layer 16 and the $Al_xGa_{1-x}N$ buffer layer 44 as a transition metal element. However, the transition metal element added in the GaN buffer layer 16 and the $Al_xGa_{1-x}N$ buffer layer 44 is not limited to Fe. By adding various transition metal elements in the GaN buffer layer 16 and the $Al_xGa_{1-x}N$ buffer layer 44 other than Fe, the formation of the low resistance layer can be avoided the same as the case of adding Fe. At least one kind of a metal element selected from the group consisting of V, Cr, Mn, Fe, and Co may be added as the transition metal element. Further, at least one kind of a metal element selected from the group consisting of Sc, Ti, Ni, Cu, Y, Zr, Nb, Mo, Tc, Ru, Rh, Pd, and Ag may be added as the transition metal element.

Moreover, the above-described embodiments explain the case of forming the GaN buffer layer 16 and the $Al_xGa_{1-x}N$ buffer layer 44 as a buffer layer in which a transition metal element is added between the conductive SiC substrate and the i-type GaN layer 18. However, the buffer layer in which the transition metal element is added may be an $Al_xGa_{1-x}N$ layer having Al composition x of $0 \leq x \leq 1$ in which the transition metal element is added.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A compound semiconductor device comprising:
   a buffer layer formed on a conductive SiC substrate;
   an i-type GaN-based carrier transit layer formed on the buffer layer;
   a carrier supply layer formed on the carrier transit layer;
   a source electrode and a drain electrode formed on the carrier supply layer; and
   a gate electrode formed on the carrier supply layer between the source electrode and the drain electrode, wherein the buffer layer includes
   a first AlN layer formed on the conductive SiC substrate;
   a second AlN layer formed on the first AlN layer; and
   an $Al_xGa_{1-x}N$ layer formed on the second AlN layer, in which a transition metal element is added, and in which the Al composition x is $0 \leq x \leq 1$,
   wherein a first surface between the first AlN layer and the second AlN layer has greater textured roughness than a second surface between the conductive SiC substrate and the first AlN layer;
   wherein the textured roughness has a plurality of tips of different heights.

2. The compound semiconductor device according to claim 1, wherein the carrier transit layer is a GaN layer or an InGaN layer.

3. The compound semiconductor device according to claim 1, wherein the transition metal element is at least one kind of metal element selected from the group consisting of V, Cr, Mn, Fe, and Co.

4. The compound semiconductor device according to claim 1, wherein the transition metal element is at least one kind of metal element selected from the group consisting of Sc, Ti, Ni, Cu, Y, Zr, Nb, Mo, Tc, Ru, Rh, Pd, and Ag.

5. The compound semiconductor device according to claim 1, wherein a impurity for reducing the carrier concentration is not added in the carrier transit layer.

6. The compound semiconductor device according to claim 1, wherein a thickness of the carrier transit layer is 0.5 μm or more.

7. The compound semiconductor device according to claim 1, wherein a thickness of the Al.sub.xGa.sub.1-xN layer is 0.2 μm or more.

8. The compound semiconductor device according to claim 1, wherein an average thickness of the buffer layer is 10 μm or more.

9. The compound semiconductor device according to claim 8, wherein the average thickness of the buffer layer is 15 μm or more.

10. The compound semiconductor device according to claim 1, wherein the first AlN layer is thicker than the second AlN layer.

11. The compound semiconductor device according to claim 1, wherein the textured roughness has a plurality of mounds corresponding to each of the plurality of tips and some of the plurality of mounds have different widths.

* * * * *